United States Patent
Kimura et al.

(10) Patent No.: US 7,146,582 B2
(45) Date of Patent: Dec. 5, 2006

(54) LOGIC CIRCUIT OPTIMIZING METHOD, LOGIC CIRCUIT OPTIMIZING DEVICE AND LOGIC CIRCUIT COMPOSING DEVICE

(75) Inventors: Tomoo Kimura, Fukuoka (JP); Kenichi Ishida, Kyotanabe (JP); Tomoyuki Inomoto, Iizuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 401 days.

(21) Appl. No.: 10/773,276

(22) Filed: Feb. 9, 2004

(65) Prior Publication Data

US 2004/0237055 A1 Nov. 25, 2004

(30) Foreign Application Priority Data

Feb. 10, 2003 (JP) .............................. 2003-032438

(51) Int. Cl.
 *G06F 17/50* (2006.01)
(52) U.S. Cl. .............................. 716/2; 716/7

(58) Field of Classification Search .................... 716/2, 716/7
See application file for complete search history.

(56) References Cited

U.S. PATENT DOCUMENTS 5,452,239 A * 9/1995 Dai et al. ..................... 709/19
5,682,321 A 10/1997 Ding et al.
6,618,834 B1 * 9/2003 Takeyama et al. ............. 716/2

FOREIGN PATENT DOCUMENTS

JP 2000-36737 2/2000

* cited by examiner

*Primary Examiner*—Vuthe Siek
(74) *Attorney, Agent, or Firm*—Wenderoth, Lind & Ponack, L.L.P.

(57) ABSTRACT

A dividing flip-flop FF2 is inserted in a cluster C of which the cluster length exceeds a predetermined cluster length. The flip-flop inserted cluster C is re-clustered, generating subdivided clusters C1 and C2. Therefore, the degree of freedom is increased in allocating clusters to a variable logic element such as an FPGA in a logical emulation device.

16 Claims, 17 Drawing Sheets module example_module(A,B,C,OUT)
input A,B,C;
output OUT;

x=(A+B)*(A*B);                  40 case OUT(C)
        1'b0:OUT=x;                 41
        1'b1:OUT= x;
    endcase endmodule

```
module example_module(A,B,C,OUT)
input A,B,C;
output OUT;
```
```
x=(A+B)*(A*B);                    40
```
```
always(negedge CLK)               42
   _x=x;
```
```
case OUT(C)                       41
    1'b0:OUT=_x;
    1'b1:OUT= _x;
endcase
``` endmodule

| kinds of memory | conversion value (number of circuit stages) |
|---|---|
| 4Mbit SRAM | 10 |
| 1Mbit SRAM | 2 |

LOGIC CIRCUIT OPTIMIZING METHOD, LOGIC CIRCUIT OPTIMIZING DEVICE AND LOGIC CIRCUIT COMPOSING DEVICE

BACKGROUND OF THE INVENTION

1. Field of the Invention

The present invention relates to a logic circuit optimizing method and arts related thereto for generating circuit information supplied to a logic emulation device that verifies logic of a semiconductor integrated circuit.

2. Description of the Related Art

Large scaled LSIs (large scale integrated circuits) in recent years have made it impossible to verify a logic circuit by a software simulation.

Therefore, a logic emulation device that reproduces (emulates) circuit operation by hardware is used.

The logic emulation device is roughly classified into two types.

One is a processor-type logic emulation device that emulates with great calculating ability with a plurality of processors installed in the device.

The other is an FPGA-type logic emulation device to emulate logic operation with a plurality of programmable devices (variable logic elements). The FPGA-type logic emulation device includes such as an FPGA (Field Programmable Gate Array) that allows users to change circuit operation freely.

Published Japanese Patent Application Laid-Open No. 2000-36737 (patent reference no. 1) disclosed an example of the FPGA-type emulation device as a prior art.

As is shown in FIG. 19, a logic emulation device 100 in the prior art is comprised of logic chips 101–103, a memory module 104, a user specification chip 105 and an interconnection chip 106.

Each of the logic chips 101–103 is an FPGA. The memory module 104 emulates a memory device. The user specification chip 105 is a hardware IP (intellectual property) such as an LSI used arbitrarily by users.

The interconnection chip 106 connects the logic chips 101–103, the memory module 104 and the user specification chip 105 mutually with crossbar switch structure.

The fundamental technique in allotting circuits to an FPGA, disclosed in the patent reference no. 1, will be described in the following.

A logic circuit is basically comprised of flip-flops and combining circuits that connect with these flip-flops.

Accordingly, a logic circuit is allotted to an FPGA in a unit of cluster. A cluster is a circuit group that is comprised of a combining circuit that exists from an input terminal of a flip-flop in the current stage toward an output terminal of a flip-flop or plural flip-flops in the previous stage. The extraction of a cluster is called clustering.

The clustering will be explained with the accompanying drawings.

FIG. 20 is a descriptive illustration of clustering. FIG. 20(a) is a schematic diagram of a logic circuit before clustering, and FIG. 20(b) is a schematic diagram of the logic circuit after clustering.

FIG. 20(a) illustrates an example of circuit structure that connects a flip-flop FF0 to flip-flops FF1 and FF2. The flip-flop FF0 and the flip-flops FF1 and FF2 are connected by a combining circuit.

In the example of the circuit structure of FIG. 20(a), when the clustering is practiced, a cluster 107 and a cluster 108 are made as shown in FIG. 20(b). The cluster 107 is comprised of a combining circuit 109 and the flip-flop FF1. The cluster 108 is comprised of a combining circuit 110 and the flip-flop FF2.

Such clustering will be practiced to all the flip-flops in the given circuit. The cluster created in this way will be allotted to an FPGA.

FIG. 21 is an exemplified illustration of clusters allotted to the FPGA. Clusters 111 are allotted to an FPGA 112 after clustering as shown in FIG. 21.

The technique of allotting a logic circuit to an FPGA in a unit of cluster has a purpose to avoid a lack in a number of I/O (input/output) of the FPGA, which is indicated by Rent's rule.

Rent's rule is a rule that shows the relationships between I/O pins (including block pins) and circuit scale in logic design, which was proposed by E. F. Rent of IBM in 1960. (http://www.cedcc.psu.edu/ee497 i/rents_rule.PDF).

The following expression is an equation given by Rent's rule.

$$Np = Kp \cdot Ng^x \qquad \text{[Equation 1]}$$

In Equation 1, "Np" is the number of I/O pins, and "Ng" is a circuit scale (the number of circuits (gates)). "X" is the Rent's constant, and "Kp" is a proportionality constant.

According to Rent's rule, the number of I/O pins increases in an exponential relationship with the circuit scale.

Process with thinner lines of today's semiconductors has made LSIs even more larger-scaled, which has made it more difficult to allot logic circuits to FPGAs.

Meanwhile, high-speed operation of the LSIs is also required; therefore, the number of the circuit stages among flip-flops tends to be the same or reduced. However, a degree of parallel of combining circuits has been increased.

This causes a problem that logic circuits are not allotted appropriately to FPGAs even after clustering.

For example, when a cluster to be allotted to an FPGA is larger than the remaining circuit scale available in the FPGA, the cluster will not be allotted to the FPGA, and will be allotted to another FPGA instead.

In this case, the utilization efficiency of the FPGA will be lowered, which causes a problem that the circuit scale that can be treated with a logic emulation device becomes smaller.

If the utilization efficiency of the FPGA is low, the circuit density to be allotted becomes smaller, and signal delay in the circuits becomes larger.

Accordingly, the signal delay is adversely added to the FPGA operation, which causes a problem that the operation speed or the emulation speed reduces.

OBJECTS AND SUMMARY OF THE INVENTION

The present invention provides a logic circuit optimizing method that can improve the utilization efficiency of variable logic elements in a logic emulation device, and arts related thereto.

A first aspect of the present invention provides a logic circuit optimizing method comprising: clustering logic circuits included in inputted logic circuit information to obtain primary clusters; inserting a flip-flop to a cluster whose cluster length exceeds predetermined cluster length, the cluster being one of the primary clusters obtained in the clustering; and re-clustering the flip-flop inserted cluster to obtain secondary clusters.

With this structure, a flip-flop is inserted into a cluster with longer cluster length; thereby the cluster with longer cluster length is divided into a plurality of clusters with shorter cluster length.

This feature makes the allotment more flexible when allotting a cluster to a variable logic element (for example, an FPGA) in a logic emulation device.

Inefficiency in adopting many gates, due to the number of I/O pins of the variable logic elements as indicated by Rent's rule, does not occur. Therefore, the utilization efficiency of the variable logic elements is improved.

In this way, the logic circuit allotted to the logic emulation device is optimized.

A second aspect of the present invention provides a logic circuit optimizing method as defined in the first aspect, wherein the inserting a flip-flop to a cluster comprises: measuring cluster length of each of the primary clusters obtained in the clustering; selecting a cluster whose cluster length exceeds the predetermined cluster length, the cluster being one of the primary clusters obtained in the clustering; and inserting a flip-flop to the selected cluster, wherein, when there exists a cluster whose cluster length exceeds the predetermined cluster length among the primary clusters obtained in the clustering, the inserting a flip-flop to the selected cluster and the re-clustering the flip-flop inserted cluster are performed.

With this structure, a flip-flop is inserted into each of all clusters of which the cluster length exceeds a predetermined cluster length. Thereby, further optimization is made.

A third aspect of the present invention provides a logic circuit optimizing method as defined in the first aspect, further comprising: inserting a flip-flop to a cluster that is too large to be contained in a variable logic element of a logic emulation device, when the cluster is allotted to the variable logic element, the cluster being included in logic circuit information after the clustering and the re-clustering; and re-clustering the flip-flop inserted cluster.

With this structure, the logic circuit allotted to the logic emulation device can be further optimized.

A fourth aspect of the present invention provides a logic circuit optimizing method as defined in the first aspect, further comprising: substituting a logic circuit for a to-be-logically-emulated memory device, by expressing a memory device in terms of circuit length, the memory device embodying the to-be-logically-emulated memory device.

With this structure, a memory device to be logically emulated can be optimized as in the usual circuit.

A fifth aspect of the present invention provides a logic circuit optimizing method as defined in the first aspect, wherein the circuit length is expressed in terms of a number of cascading circuit stages.

With this structure, a memory device to be logically emulated can be optimized as in the usual circuit, since the memory device that embodies the memory device to be logically emulated is expressed by the number of cascading circuit stages.

A sixth aspect of the present invention provides a logic circuit optimizing method as defined in the first aspect, wherein the circuit length is expressed in terms of a signal propagation time.

With this structure, a memory device to be logically emulated can be optimized as in the usual circuit, since the memory device that embodies the memory device to be logically emulated is expressed by a signal propagation time.

A seventh aspect of the present invention provides a logic circuit optimizing method as defined in the first aspect, wherein the cluster length is expressed in terms of a number of cascading circuit stages.

With this structure, a cluster with many numbers of circuit stages is divided into a plurality of clusters with the fewer numbers of circuit stages, since a flip-flop is inserted into the cluster with many numbers of circuit stages.

This feature makes the allotment more flexible when allotting a cluster to a variable logic element, thereby improving the utilization efficiency of the variable logic element.

An eighth aspect of the present invention provides a logic circuit optimizing method as defined in the first aspect, wherein the cluster length is expressed in terms of a signal propagation time.

With this structure, a cluster with a longer signal propagation time is divided into a plurality of clusters with a shorter signal propagation time, since a flip-flop is inserted into the cluster with a longer signal propagation time.

This feature makes the allotment more flexible when allotting a cluster to a variable logic element, thereby improving the utilization efficiency of the variable logic element.

A ninth aspect of the present invention provides a logic circuit optimizing method comprising: inserting a flip-flop to a cluster that is too large to be contained in a variable logic element of a logic emulation device, when the cluster is allotted to the variable logic element, the cluster being included in logic circuit information after clustering; and re-clustering the flip-flop inserted cluster.

With this structure, since a flip-flop is inserted into a cluster that can not be contained in a variable logic element (for example, an FPGA), the cluster that can not be contained in the variable logic element is divided into a plurality of clusters with shorter cluster length.

As a result, a cluster with shorter cluster length can be allotted to a variable logic element, improving the utilization efficiency of the variable logic element.

Thereby, a logic circuit to be allotted to a logic emulation device can be optimized.

A tenth aspect of the present invention provides a logic circuit optimizing method as defined in the first aspect, wherein an operation clock frequency of a new flip-flop to be inserted is higher than that of a flip-flop already included in a cluster to which the new flip-flop is to be inserted.

With this structure, even after a new flip-flop is inserted, the same operation speed is maintained as before the new flip-flop is inserted.

An eleventh aspect of the present invention provides a logic circuit optimizing method, comprising: calculating a number of operational elements included in a module that is described by hardware description language; and inserting a flip-flop described by hardware description language to a module that possesses operational elements more than a prescribed number.

With this structure, the cluster length of a cluster after logic composition becomes shorter, which makes the allotment more flexible when allotting a cluster to a variable logic element (for example, an FPGA) in a logic emulation device.

Inefficiency in adopting many gates, due to the number of I/O pins of the variable logic elements as indicated by Rent's rule, does not occur. Therefore, the utilization efficiency of the variable logic elements is improved.

Thereby, a logic circuit to be allotted to a logic emulation device can be optimized.

This feature also makes the process faster than a case in which a flip-flop is inserted after logic composition, since the flip-flop is inserted at a hardware description language stage.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Hereinafter, a description is given of embodiments of the invention with reference to the accompanying drawings.

(First Embodiment)

Figure 1:
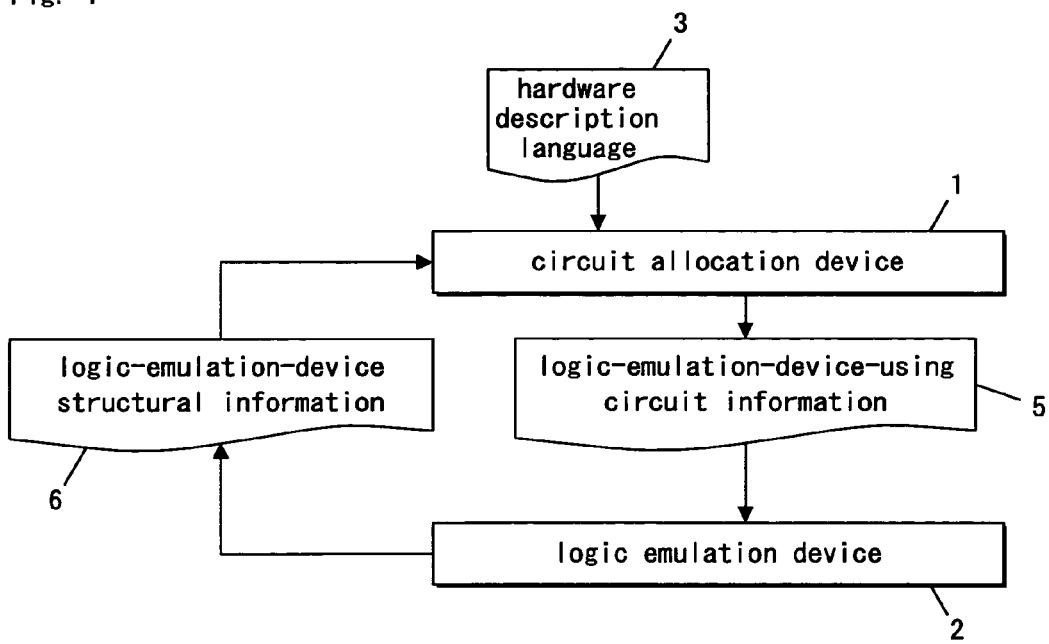
FIG. 1 is a block diagram illustrating a logic emulation system according to a first embodiment of the present invention.

FIG. 1 is a block diagram illustrating a logic emulation system according to a first embodiment of the present invention.

As shown in FIG. 1, this logic emulation system includes a circuit allocation device 1 and a logic emulation device 2.

Although not illustrated, an FPGA and a memory device, etc. are installed in the logic emulation device 2, and a memory device is installed in the FPGA.

The FPGA is an example of a variable logic element (a programmable device) that a user can change circuit operation freely.

Figure 19:
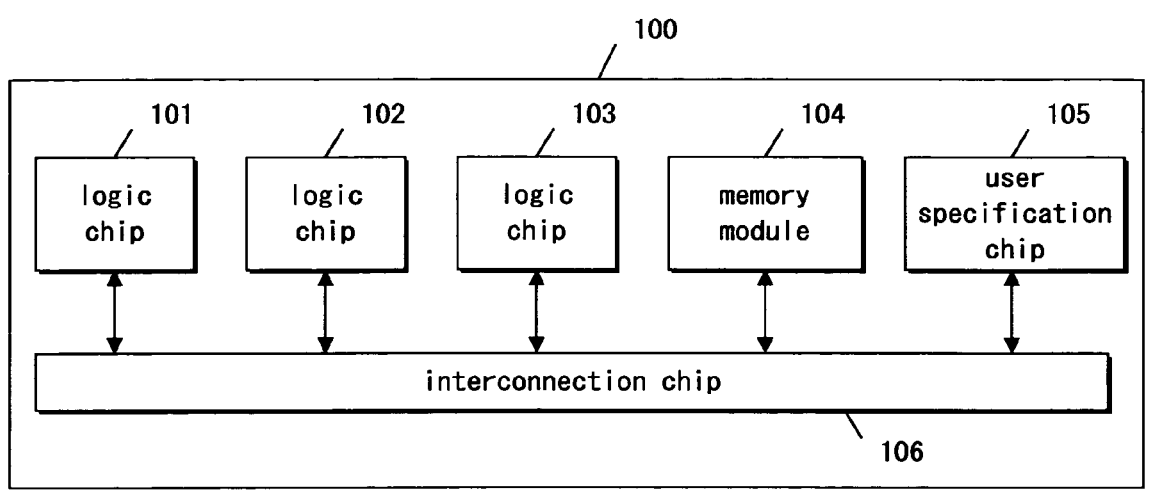
FIG. 19 is a block diagram illustrating a logic emulation device in a prior art.
Figure 20A:
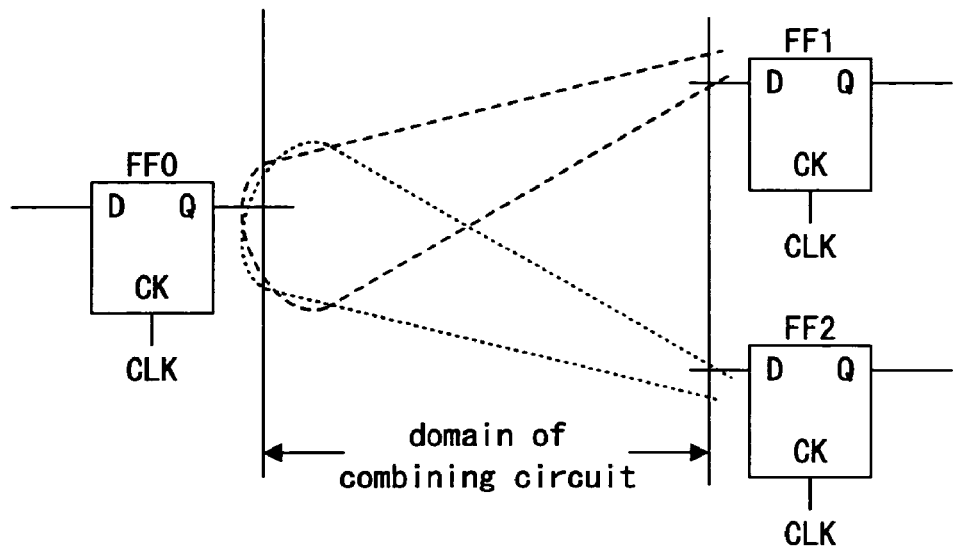
FIG. 20(a) is a schematic diagram illustrating a logic circuit before clustering in the prior art.
Figure 20B:
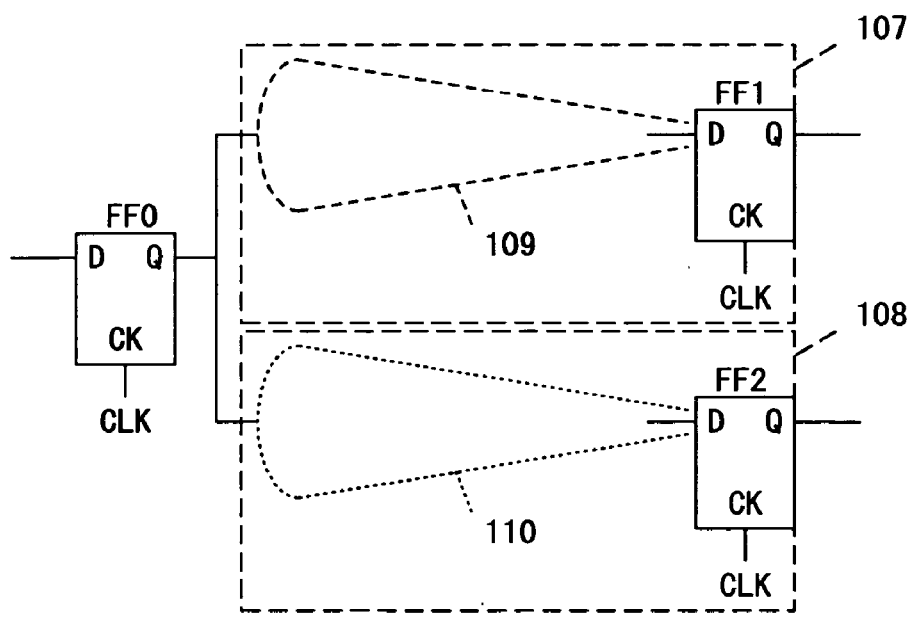
FIG. 20(b) is a schematic diagram illustrating logic circuits after clustering in the prior art; and, FIG. 21 is an exemplified illustration showing a cluster allotted to an FPGA in the logic emulation device in the prior art.
Figure 21:
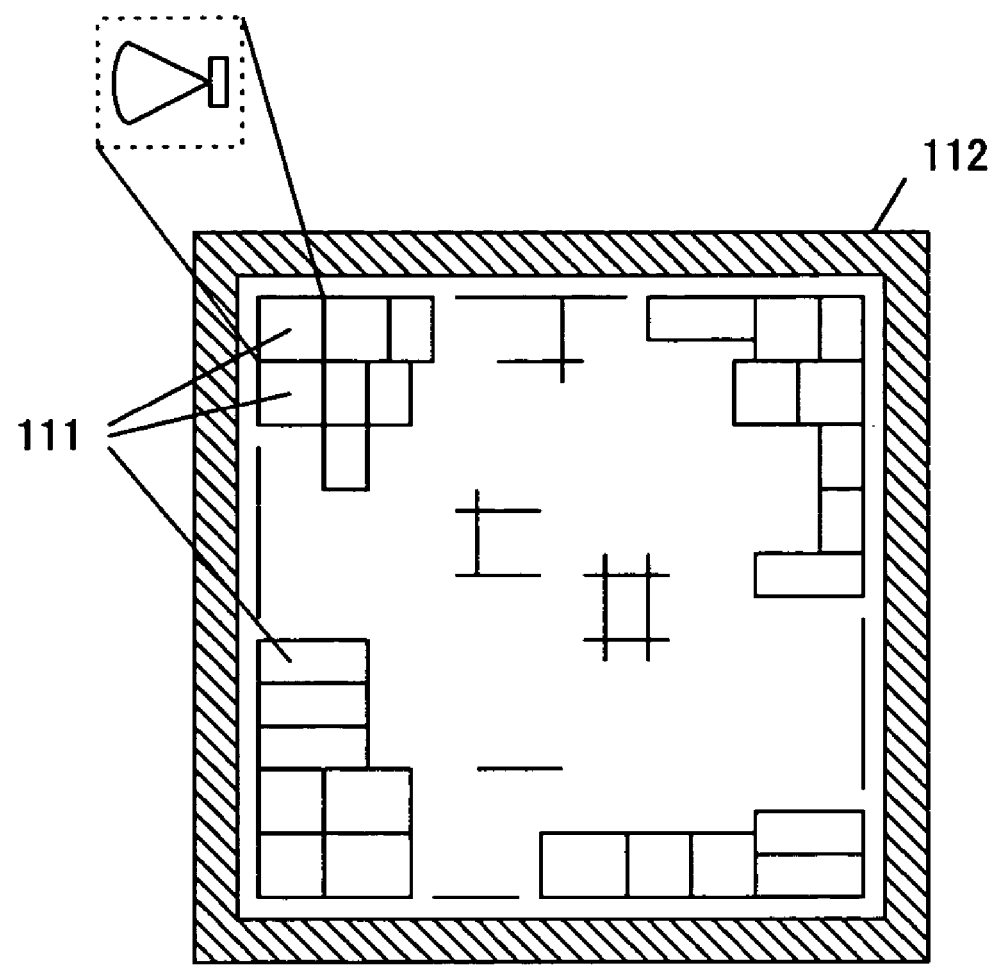

As the logic emulation device 2, a logic emulation device shown in FIG. 19 can be used for example.

Figure 2:
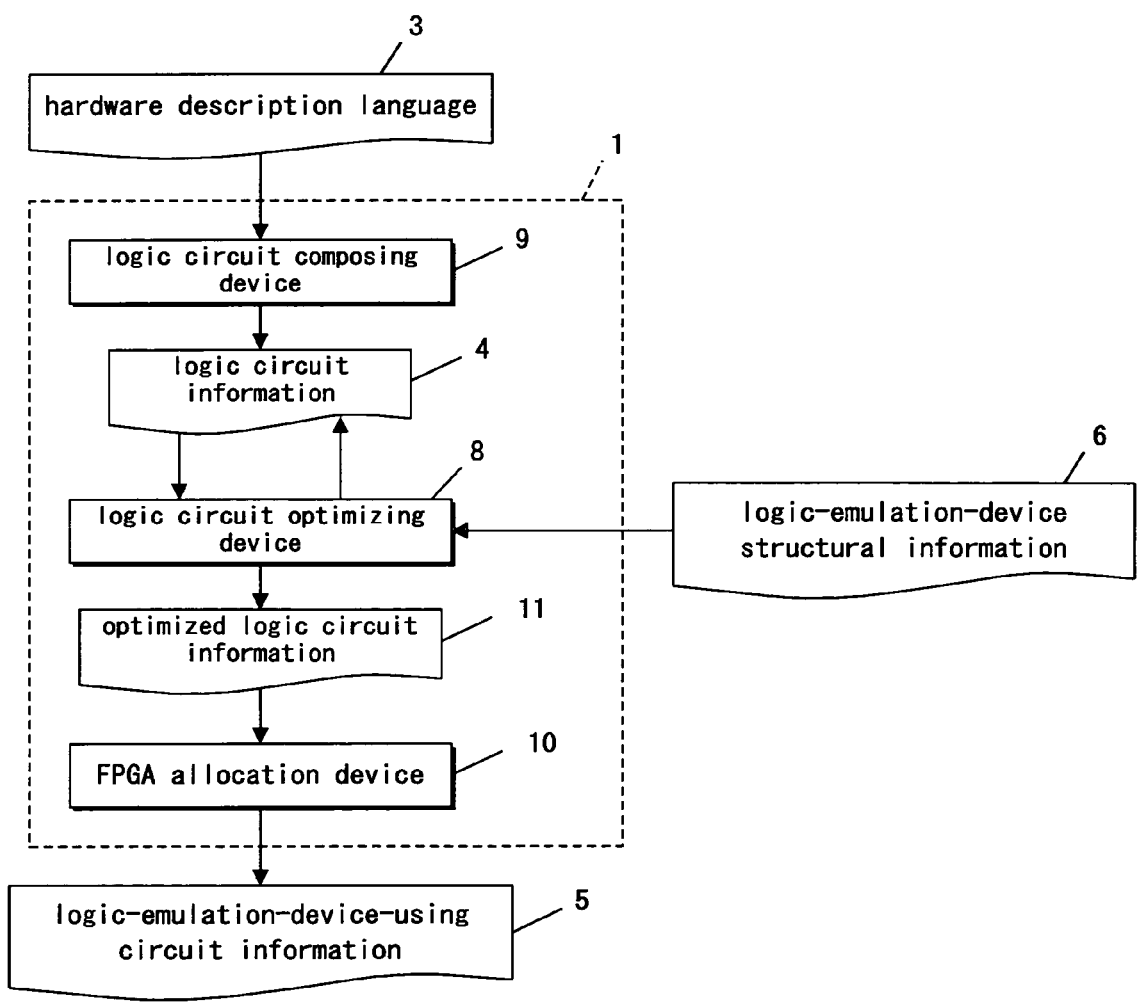
FIG. 2 is a block diagram illustrating a circuit allocation device according to the first embodiment of the present invention.

FIG. 2 is a block diagram illustrating the circuit allocation device 1 in FIG. 1. Additionally, components same as or similar to those of FIG. 2 are identified with the same reference symbols or numerals of those of FIG. 1.

As shown in FIG. 2, the circuit allocation device 1 in FIG. 1 includes a logic circuit composing device 9, a logic circuit optimizing device 8 and an FPGA allocation device 10.

The logic circuit composing device 9 practices logic composing, and generates logic circuit information 4 from a hardware description language (HDL) 3.

The hardware description language 3 is a language, such as Verilog-HDL or VHDL, for describing a logic circuit at a functional level.

The logic circuit information 4 is information that describes a logic circuit at a gate level, for example, a net-list.

Figure 3:
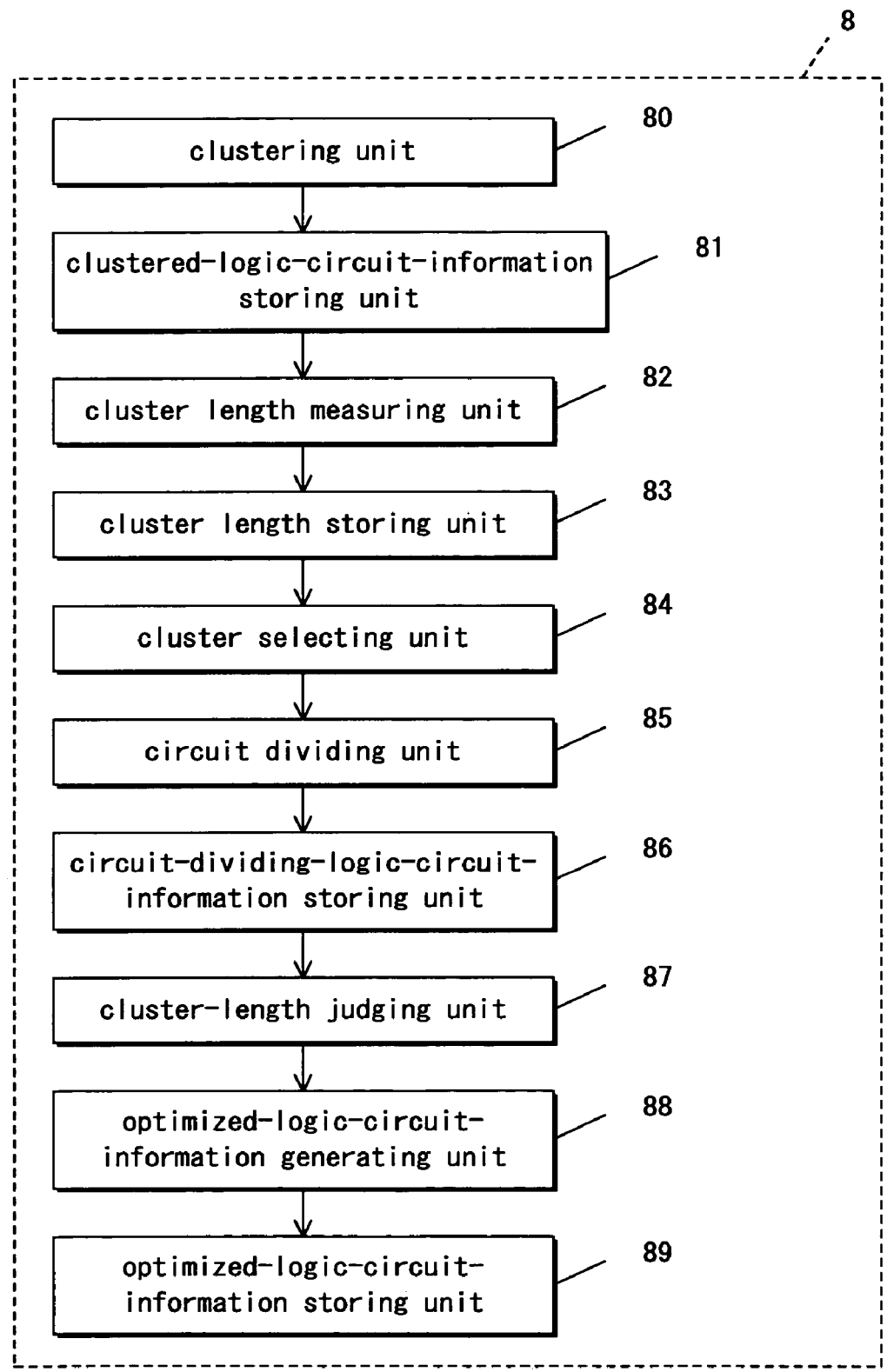
FIG. 3 is a block diagram illustrating a logic circuit optimizing device according to the first embodiment of the present invention.

FIG. 3 is a block diagram illustrating the logic circuit optimizing device 8 shown in FIG. 2. As shown in FIG. 3, the logic circuit optimizing device 8 includes a clustering unit 80, a clustered-logic-circuit-information storing unit 81, a cluster length measuring unit 82, a cluster length storing unit 83, a cluster selecting unit 84, a circuit dividing unit 85, a circuit-dividing-logic-circuit-information storing unit 86, a cluster-length judging unit 87, an optimized-logic-circuit-information generating unit 88 and an optimized-logic-circuit-information storing unit 89.

The clustering unit 80 searches flip-flops out of the logic circuit information 4 generated by the logic circuit composing device 9, and practices a clustering process for all the flip-flops.

To put it more concretely, the clustering unit 80 searches a combining circuit from an input terminal of a currently chosen flip-flop toward an output terminal of a flip-flop or plural flip-flops in the previous stage, and extracts a cluster comprised of the currently chosen flip-flop and the searched combining circuit.

The clustered-logic-circuit-information storing unit 81 stores the logic circuit information 4 after clustering (hereinafter called "clustered logic circuit information").

The cluster length measuring unit 82 measures the cluster length of all the clusters stored in the clustered-logic-circuit-information storing unit 81.

The cluster length can be expressed, for example, by the number of circuit stages.

The cluster length can be alternatively expressed by propagation time when a signal propagates across a cluster.

The cluster length storing unit 83 stores the cluster length measured by the cluster length measuring unit 82. The stored cluster length is related to each cluster.

The cluster selecting unit 84 selects clusters of which the cluster length exceeds a predetermined value with reference to the cluster length storing unit 83.

The above-described predetermined value can be designated by a user arbitrarily; the predetermined value may be an average of all cluster lengths or an optimum value for the logic emulation device 2.

The circuit dividing unit 85 inserts a flip-flop that divides a combining circuit of a cluster of which the cluster length exceeds the predetermined value. The inserted flip-flop is called a "dividing flip-flop" hereinafter.

There are some cases where a plurality of clusters of which the cluster length exceeds the predetermined value may exist. Even in these cases, dividing flip-flops are inserted into all the clusters of which the cluster length exceeds the predetermined value.

The process by the circuit dividing unit 85 will be described with examples.

Figure 4A:
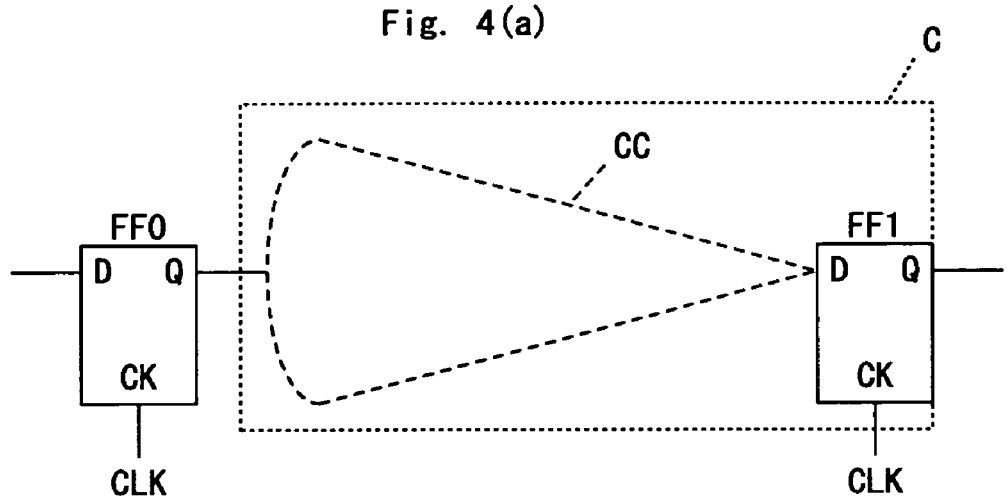
FIG. 4(a) is an exemplified illustration showing a cluster before dividing a circuit according to the first embodiment of the present invention.
Figure 4B:
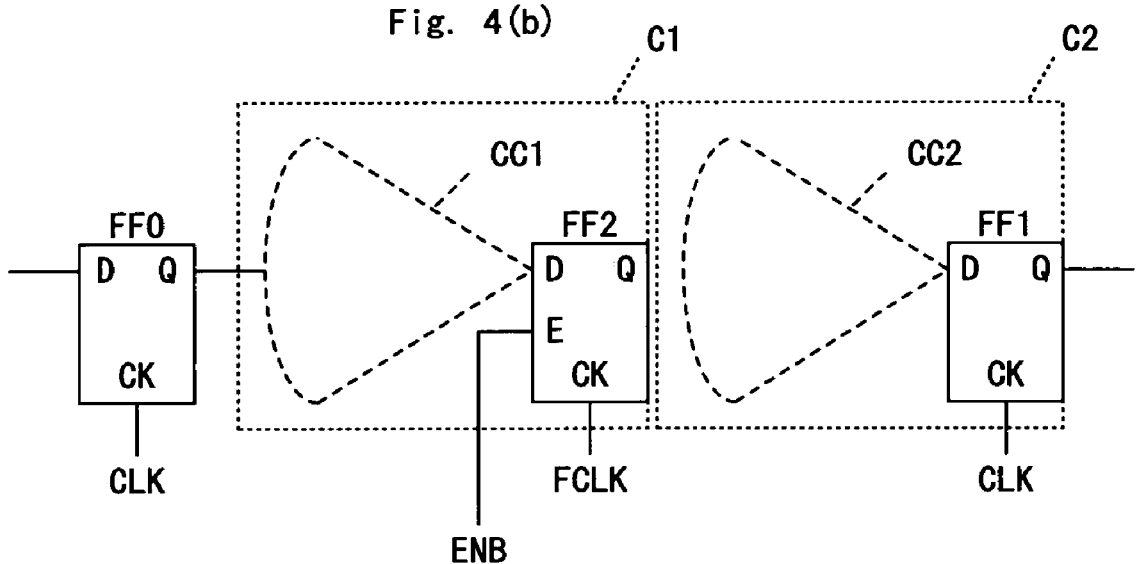
FIG. 4(b) is an exemplified illustration showing clusters after dividing the circuit according to the first embodiment of the present invention.

FIG. 4 is an exemplified illustration of a process by the circuit dividing unit 85. FIG. 4(*a*) shows a cluster before a circuit is divided, and FIG. 4(*b*) shows a cluster after the circuit is divided.

As shown in FIG. 4(*a*), the cluster length of a cluster C comprised of a combining circuit CC and a flip-flop FF1 is supposed to exceed the predetermined value.

The circuit dividing unit 85 inserts a dividing flip-flop FF2 into the cluster C, and the clustering unit 80 practices re-clustering for the cluster C into which the dividing flip-flop FF2 has been inserted.

As a result, the cluster C is divided into a cluster C1 that is comprised of a combining circuit CC1 and a flip-flop FF2, and a cluster C2 that is comprised of a combining circuit CC2 and a flip-flop FF1, as shown in FIG. 4(*b*).

The dividing flip-flop FF2 here operates at an operation clock FCLK that is different from an operation clock CLK for other flip-flops FF0 and FF1. This point will be described in detail.

As shown in FIG. 4(*a*), the combining circuit CC between the flip-flop FF0 and the flip-flop FF1 operates by one clock of the operation clock CLK.

Accordingly, the flip-flop FF0 through the flip-flop FF1 must operate by one clock of the operation clock CLK, even after the dividing flip-flop FF2 is inserted as shown in FIG. 4(*b*). Therefore, the operation clock FCLK of the dividing flip-flop FF2 is forced to synchronize with a falling edge of the operation clock CLK. Here, it is assumed that the flip-flops FF0 and FF1 and the dividing flip-flop FF2 operate at a rising edge.

For example, the operation clock FCLK may be a reversed clock of the operation clock CLK. Alternatively, the operation clock FCLK may be a pulse-shaped clock that synchronizes with the falling edge of the operation clock CLK.

Thus, when the operation clock FCLK is a clock that synchronizes with the falling edge of the operation clock CLK, each of the combining circuit CC1 between the flip-flop FF0 and the dividing flip-flop FF2, and the combining circuit CC2 between the dividing flip-flop FF2 and the flip-flop FF1 are required to operate within the half cycle of the operation clock CLK.

Accordingly, the dividing flip-flop FF2 must be inserted at a circuit stage where each of the combining circuit CC1 and the combining circuit CC2 can operate within the half cycle of the operation clock CLK.

A permission (enable) control of flip-flop functions is possible to apply for the dividing flip-flop FF2.

That is, the dividing flip-flop FF2 can change its operation to either a latch operation or a through operation, by an enable signal ENB of the flip-flop functions. This feature makes it possible for the circuit in a disenabling state to return to the same circuit structure as the circuit before the dividing flip-flop FF2 is inserted (FIG. 4(*a*)). Thereby, logical equivalency between the cases when the dividing flip-flop FF2 is inserted and not inserted can be easily verified.

As described above, the clustering unit 80 practiced re-clustering for the cluster C into which the dividing flip-flop FF2 had been inserted, and created the clusters C1 and C2.

The clustering unit 80 replaces the information of the cluster C with the information of clusters C1 and C2 and updates the clustered logic circuit information, stored in the clustered-logic-circuit-information storing unit 81.

The cluster length judging unit 87 shown in FIG. 3 compares a cluster length between the flip-flop FF0 and the dividing flip-flop FF2, and a cluster length between the dividing flip-flop FF2 and the flip-flop FF1, with the predetermined value.

When either the cluster length between the flip-flop FF0 and the dividing flip-flop FF2, or the cluster length between the dividing flip-flop FF2 and the flip-flop FF1, exceeds the predetermined value, the cluster length judging unit 87 orders the circuit dividing unit 85 and the clustering unit 80 to practice a circuit dividing process and a re-clustering process, respectively.

The circuit dividing process and the re-clustering process are repeated until each cluster length between the flip-flop FF0 and the dividing flip-flop FF2, and between the dividing flip-flop FF2 and the flip-flop FF1 becomes smaller than the predetermined value.

These processes make the cluster length of all clusters smaller than the predetermined value.

The predetermined value in the cluster length judging unit 87 is set to be equal to the predetermined value in the cluster selecting unit 84.

Meanwhile, when each cluster length between the flip-flop FF0 and the dividing flip-flop FF2 and between the dividing flip-flop FF2 and the flip-flop FF1 is smaller than the predetermined value, the cluster length judging unit 87 orders the optimized-logic-circuit-information generating unit 88 in FIG. 3 to practice a process.

FIG. 3 will be explained again here.

The circuit-dividing-logic-circuit-information storing unit 86 stores the updated clustered circuit information (hereinafter called "circuit dividing logic circuit information").

The optimized-logic-circuit-information generating unit 88 allocates a cluster contained in the circuit dividing logic circuit information to each FPGA installed in a logic emulation device 2, based on the circuit dividing logic circuit information and logic-emulation-device structural information 6.

The optimized-logic-circuit-information generating unit 88 generates optimized logic circuit information 11 that is comprised of the information on allotting the cluster and the circuit dividing logic circuit information.

The logic-emulation-device structural information 6 here is the information about the elements installed in the logic emulation device 2.

For example, the logic-emulation-device structural information 6 is such information that indicates the number and type of the FPGA installed in the logic emulation device 2 (e.g., the number of installable circuits (gates) or installable circuit scale, etc.).

The optimized-logic-circuit-information storing unit 89 stores the optimized logic circuit information 11.

FIG. 2 will be explained again here.

The FPGA allocation device 10 generates logic-emulation-device-using circuit information 5, based on the optimized logic circuit information 11. The logic-emulation-device-using circuit information 5 is circuit information to be used by the logic emulation device 2, and equivalent to the optimized logic circuit information 11 in a final circuit allocating condition.

The logic emulation device 2 shown in FIG. 1 allocates clusters to each FPGA and practices emulation, based on the logic-emulation-device-using circuit information 5 described above.

Next, a method to insert a dividing flip-flop will be described in detail with an example. In this example, the cluster length is defined by the number of circuit stages.

Figure 5:
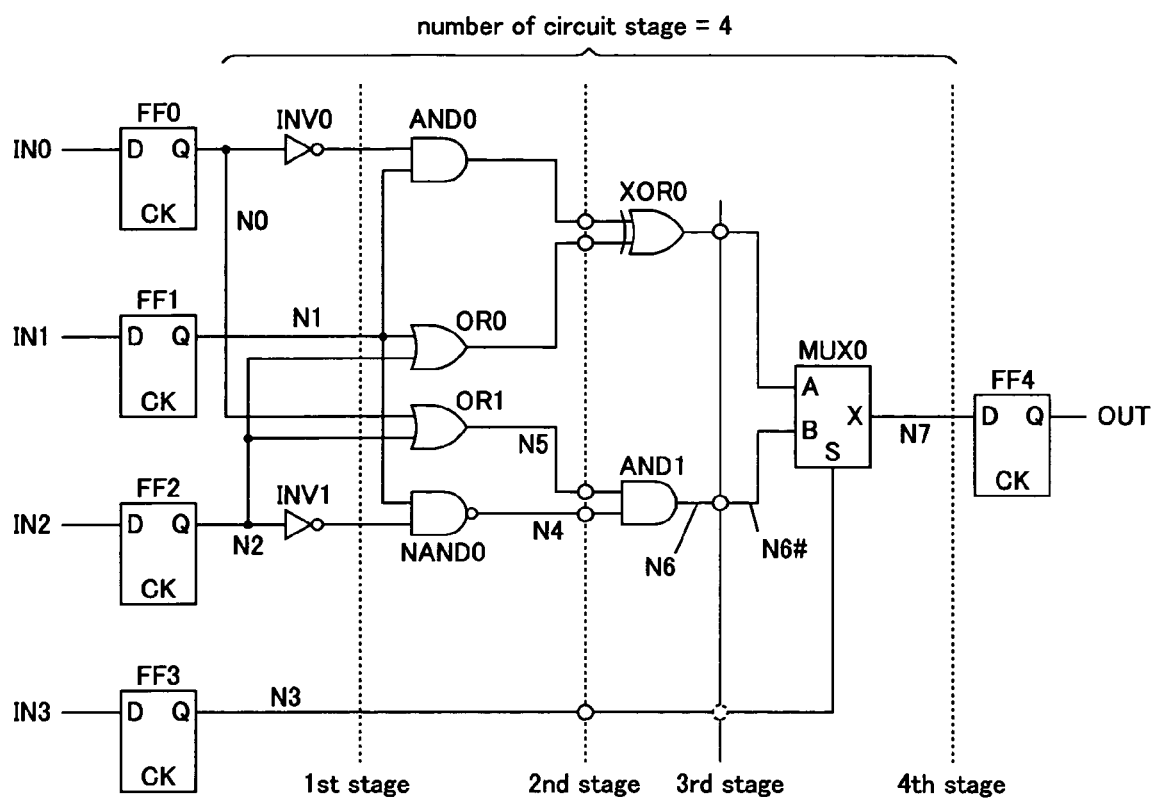
FIG. 5 is an exemplified illustration showing a cluster for explaining an inserting method of a dividing flip-flop according to the first embodiment of the present invention.

FIG. 5 is an exemplified illustration showing a cluster for explaining the method to insert a dividing flip-flop. Flip-flops FF0–FF4 in FIG. 5 are supposed to operate at a rising edge.

FIG. 5 illustrates one cluster that is comprised of a flip-flop FF4, and combining circuits between the flip-flop FF4 and the flip-flops FF0, FF1, FF2 and FF3 respectively.

As shown in FIG. 5, there are some cases where plural flip-flops FF0–FF3 may exist in the previous stages to the reference stage of the flip-flop FF4.

FIG. 4 shows an example where only one flip-flop FF0 exists in the previous stage to the reference stage of the flip-flop FF1.

Figure 6:
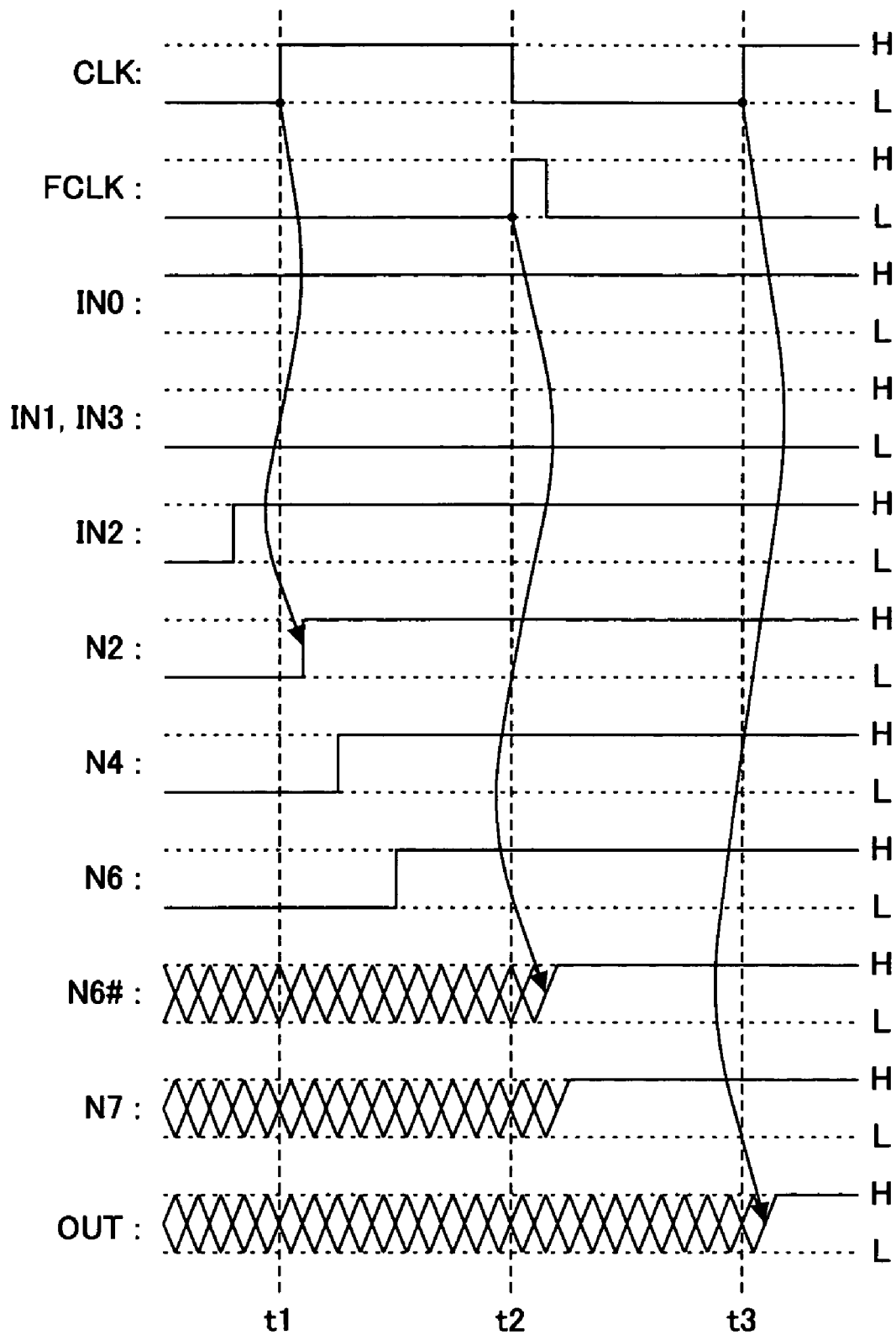
FIG. 6 is a timing chart of a cluster for explaining an inserting method of a dividing flip-flop according to the first embodiment of the present invention.

FIG. 6 is a timing chart for the cluster in FIG. 5. FIG. 6 illustrates an operation clock CLK of the flip-flops FF0–FF4, an operation clock FCLK of the dividing flip-flop, input signals IN0–IN3 into the flip-flops FF0–FF3, signal wave shapes at nodes N2, N4, N6, N6# and N7 of the cluster in FIG. 5, and an output signal OUT of the flip-flop FF4.

FIG. 6 shows an example in which the operation clock FCLK of the dividing flip-flop inserted in the cluster in FIG. 5 is a pulse-shaped clock that synchronizes with the falling edge of the operation clock CLK of the flip-flops FF0–FF4.

Accordingly, the dividing flip-flop, if necessary, must be inserted to the right point where each of the combining circuit at the previous stage and the combining circuit at the following stage of the insertion point can operate within the half cycle of the operation clock CLK.

Since the maximum number of circuit stages of the cluster in FIG. 5 is four stages, the dividing flip-flop is inserted at the second stage that is in the middle.

The number of circuit stages increases by one stage whenever passing over one element from the flip-flops FF0–FF3 toward the flip-flop FF4.

The dividing flip-flop has been inserted at the second stage in the above description. When no operation speed problem occurs even after the dividing flip-flop is inserted into the third stage, the dividing flip-flop may be inserted at the third stage.

The operation speed will be discussed, by paying attention to signal propagation from the input signal IN2 to the output signal OUT in FIG. 5.

As shown in FIG. 6, input signal IN0 is fixed to a high level, IN1 is fixed to a low level, IN2 transits from a low level to a high level, and IN3 is fixed in a low level respectively.

Since the node N2 is the output of the flip-flop FF2, the node N2 latches the input signal IN2 at the rising edge of the operation clock CLK.

The signal propagates through an inverter element INV1, a NAND-element NAND0 and an AND-element AND1.

Since the signal transition at the node N6 is finished within the half cycle of the operation clock CLK, even if the signal at the node N6 is latched by the dividing flip-flop inserted at the third stage that operates at the rising edge of the operation clock FCLK, any problem caused by signal delay does not occur.

Therefore, the wave shapes as shown in FIG. 6 are obtained at the nodes N6# and N7, which allows a cluster to be divided while maintaining the transparency of circuit operation for one cycle of the operation clock CLK.

To sum up, at the nodes N2, N4 and N6, the signals transit before time t2, corresponding to the rising edge of the operation clock CLK at time t1.

That is, the combining circuit at the previous stage to the dividing flip-flop operates within the half cycle of the operation clock CLK.

On the other hand, at the nodes N6# and N7, the signals transit before time t3, corresponding to the rising edge of the operation clock FCLK at time t2.

That is, the combining circuit at the following stage of the dividing flip-flop operates within the half cycle of the operation clock of CLK.

This makes it clear that there is no problem on the operation speed even if the dividing flip-flop is inserted into the third step.

The output signal OUT is outputted, corresponding to the rising edge of the operation clock CLK at time t3.

The output selecting signal for a selector MUX0 is directly given from the flip-flop FF3 at the previous stage and no element exists in between these elements.

Accordingly it is not necessary to insert a dividing flip-flop between the selector MUX0 and the flip-flop FF3.

In conclusion, the dividing flip-flop is inserted between the selector MUX0 and an EXOR element XOR0, and between the selector MUX0 and the AND-element AND1.

Three dividing flip-flops are necessary when inserting the dividing flip-flops at the second stage of the cluster, while only two dividing flip-flops are necessary when inserting the dividing flip-flops at the third stage of the cluster.

Next, the process flow by the logic circuit optimizing device 8 will be explained using FIG. 3 and a flow chart shown in FIG. 7.

Figure 7:
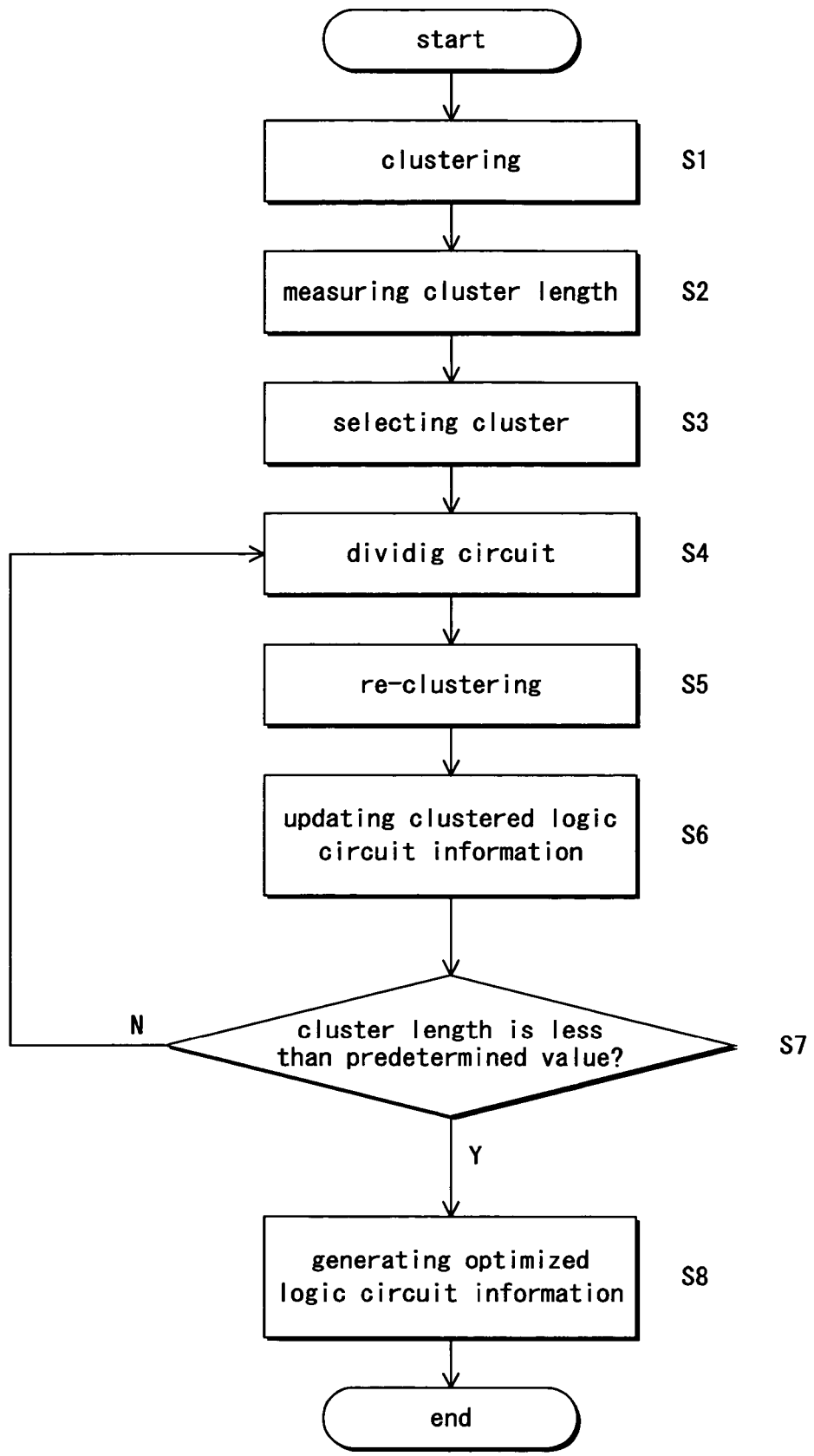
FIG. 7 is a flow chart of a logic circuit optimizing device according to the first embodiment of the present invention.

FIG. 7 is a flow chart showing a logic circuit optimizing device 8 in FIG. 3.

As shown in FIG. 7, at step S1, the clustering unit 80 practices clustering for the logic circuit information 4 to be emulated.

At step S2, the cluster-length measuring unit 82 measures the cluster length of all clusters obtained by the clustering.

At step S3, the cluster selecting unit 84 selects clusters of which the cluster length exceeds a predetermined value.

At step S4, the circuit dividing unit 85 inserts a dividing flip-flop into the cluster of which the cluster length exceeds the predetermined value and divides the circuit.

At step S5, the clustering unit 80 practices re-clustering for the cluster that the dividing flip-flop has been inserted.

At step S6, the clustering unit 80 updates clustered logic circuit information based on the result of the re-clustering.

At step S7, the cluster length judging unit 87 judges whether the cluster length of the clusters obtained by the re-clustering is smaller than the predetermined value.

At step S7, when the cluster length of the clusters obtained by the re-clustering is smaller than the predetermined value, the process goes to step S8.

At step S8, the optimized-logic-circuit-information generating unit 88 generates optimized logic circuit information 11 based on the circuit dividing logic circuit information and the logic-emulation-device structural information 6.

Meanwhile, at step S7, when the cluster length of the clusters obtained by the re-clustering exceeds the predetermined value, the process goes back to step S4. Then step S4 through step S7 are repeated, updating the clustered logic circuit information. The clustered logic circuit information finally updated becomes the circuit dividing logic circuit information.

As described above, according to the present embodiment, a cluster with longer cluster length is divided into the plurality of clusters with shorter cluster length, since a dividing flip-flop is inserted in the cluster with longer cluster length.

This feature makes the allotment more flexible when allotting the cluster to an FPGA in a logic emulation device, which improves the utilization efficiency of the FPGA.

In view of the above, the logic circuit allotted to the logic emulation device will be optimized.

The improvement in the utilization efficiency of the FPGA makes a circuit density higher, which reduces a signal delay in each circuit element. As a result, the emulation speed rises.

The circuit allocation device 1 shown in FIG. 1 can be realized by a program that operates on a computer system. However, the realization of the circuit allocation device 1 is not limited to the case where it is realized by the program.

The FPGA allocation device 10 is realized by a program called an FPGA compiler. However, the realization of the FPGA allocation device 10 is not limited to the case where it is realized by the program.

(Second Embodiment)

The whole structure of a logic emulation system according to a second embodiment of the present invention is the same as that described in FIG. 1. Accordingly, the logic emulation system in FIG. 1 will be described as a logic emulation system according to the second embodiment.

The structure of a circuit allocation device 1 according to the second embodiment is the same as that shown in FIG. 2. Accordingly, the circuit allocation device 1 in FIG. 2 will be described as the circuit allocation device 1 according to the second embodiment.

A logic circuit optimizing device 8 according to the second embodiment is the same as that shown in FIG. 3. Accordingly, the logic circuit optimizing device 8 in FIG. 3 will be described as the logic circuit optimizing device 8 according to the second embodiment.

Figure 8B:
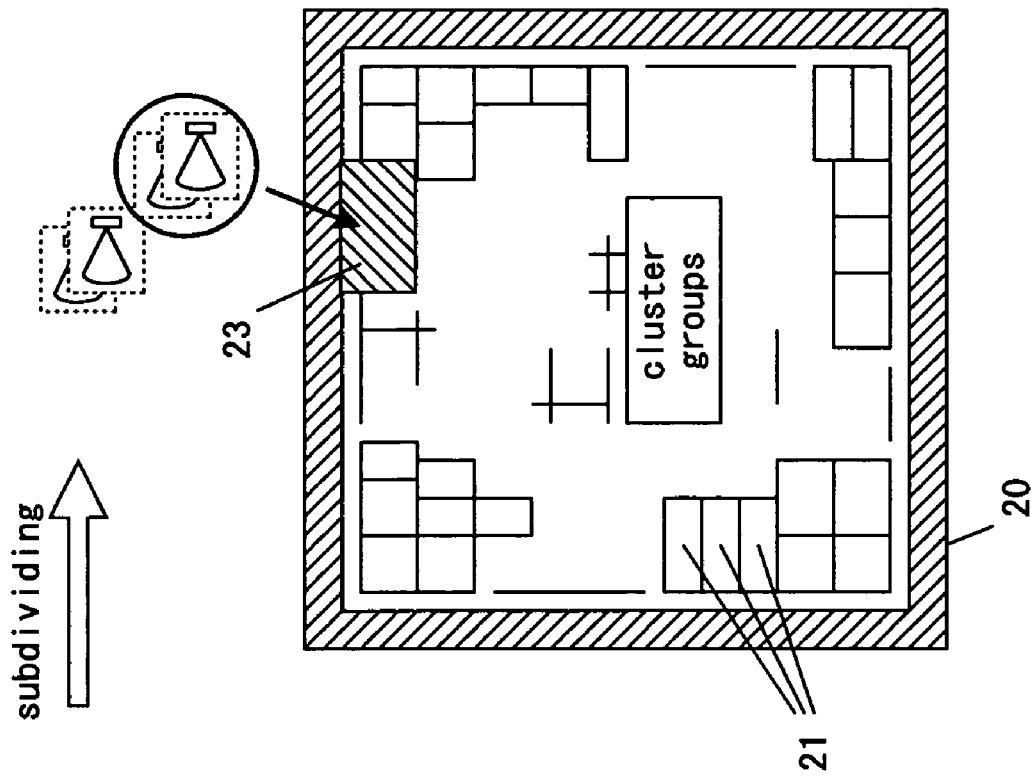
FIG. 8(b) is a descriptive illustration showing a logic circuit optimizing device according to the second embodiment of the present invention.
Figure 8A:
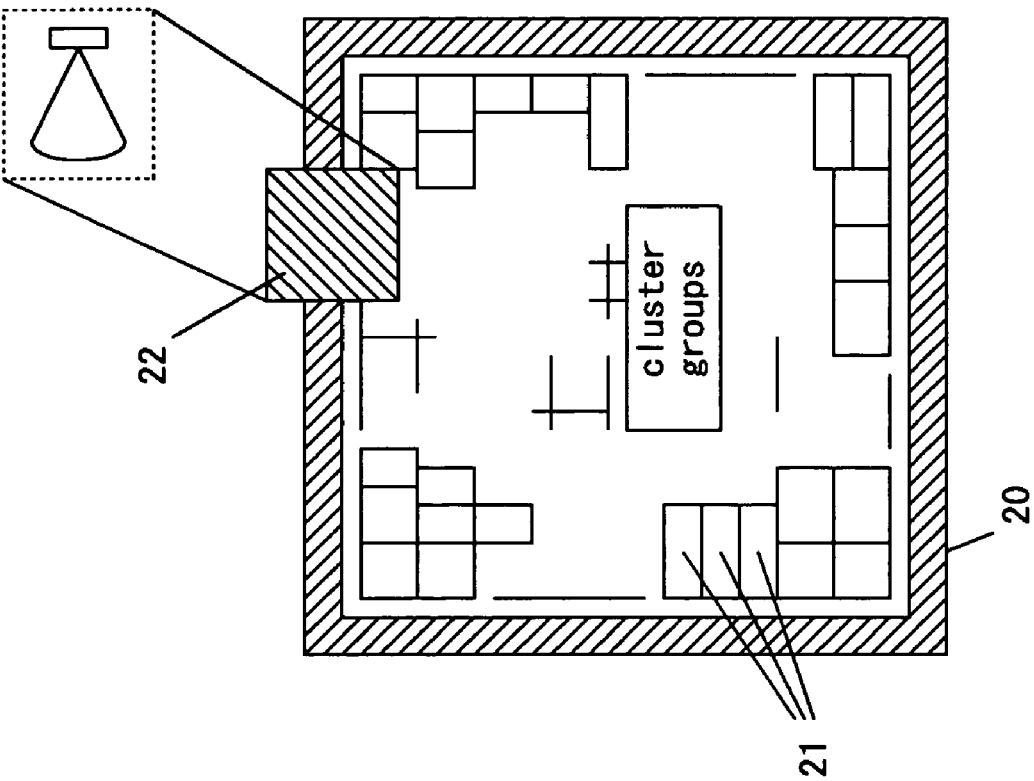
FIG. 8(a) is a descriptive illustration showing a logic circuit optimizing device according to a second embodiment of the present invention.

FIG. 8 is a descriptive illustration showing the logic circuit optimizing device 8 according to the second embodiment. FIG. 8(a) shows a situation that a cluster 22 is not contained within an FPGA20, and FIG. 8(b) shows a situation that a cluster group 23 is contained within the FPGA20.

Based on the logic-emulation-device structural information 6, the optimized-logic-circuit-information generating unit 88 in FIG. 3 determines to which FPGA each cluster contained in the circuit dividing logic circuit information is to be finally allotted, and generates the optimized logic circuit information 11.

However, there is a case where the cluster 22 to be allotted to the FPGA20 is larger than the remaining circuit scale that is available in the FPGA20. In such case, the cluster 22 happens to be allotted across the boundary of the FPGA20, as shown in FIG. 8(a).

For such case, according to the second embodiment, the cluster 22 shown in FIG. 8(a) is subdivided to make a plurality of clusters by inserting a dividing flip-flop into the cluster 22. The subdivision is repeated until all the clusters are able to be allotted within the boundary of the FPGA20. A cluster group 23 that is comprised of a number of such subdivided clusters will be allotted to the FPGA20 as shown in FIG. 8(b).

To put it more concretely, when the cluster 22 to be allotted to the FPGA20 is larger than the remaining circuit scale available in the FPGA20, the circuit dividing unit 85 inserts a dividing flip-flop in the cluster 22. The clustering unit 80 practices re-clustering for the cluster 22 that the dividing flip-flop has been inserted and updates the circuit dividing logic circuit information.

Then the optimized-logic-circuit-information generating unit 88 practices an allotting process again for the plurality of clusters obtained by subdividing the cluster 22, and updates the optimized logic circuit information 11. The practice of the allotting process is carried out under the condition of the circuit scale (the number of circuits (gates)) that can be allotted in the vacant area of the FPGA20 and the number of I/Os of the FPGA20.

As a result, a cluster group 23 that can be contained in the remaining circuit scale available in the FPGA20 is obtained and allotted to the FPGA20.

Except for the above description, the second embodiment is the same as the first embodiment, thereby, further explanation is omitted.

In the prior art, when a cluster to be allotted to an FPGA is larger than the remaining circuit scale available in the FPGA, the cluster is allotted to another FPGA. Pursuant to the present embodiment, however, when a cluster can not be contained in the vacant area of an FPGA, subdividing the cluster as described above is performed. Thereby, the utilization efficiency of the FPGA can be improved.

The process flow for the logic circuit optimizing device 8 according to the present embodiment will be explained with reference to a flow chart.

The process flow by the logic circuit optimizing device 8 according to the present embodiment is the same as the flow chart shown in FIG. 7.

Pursuant to the present embodiment, however, the generating process of the optimized logic circuit information, at step S8 of the flow chart in FIG. 7, is different. In the present embodiment, the generating process of the optimized logic circuit information following a flow chart shown in FIG. 9 is practiced instead.

Figure 9:
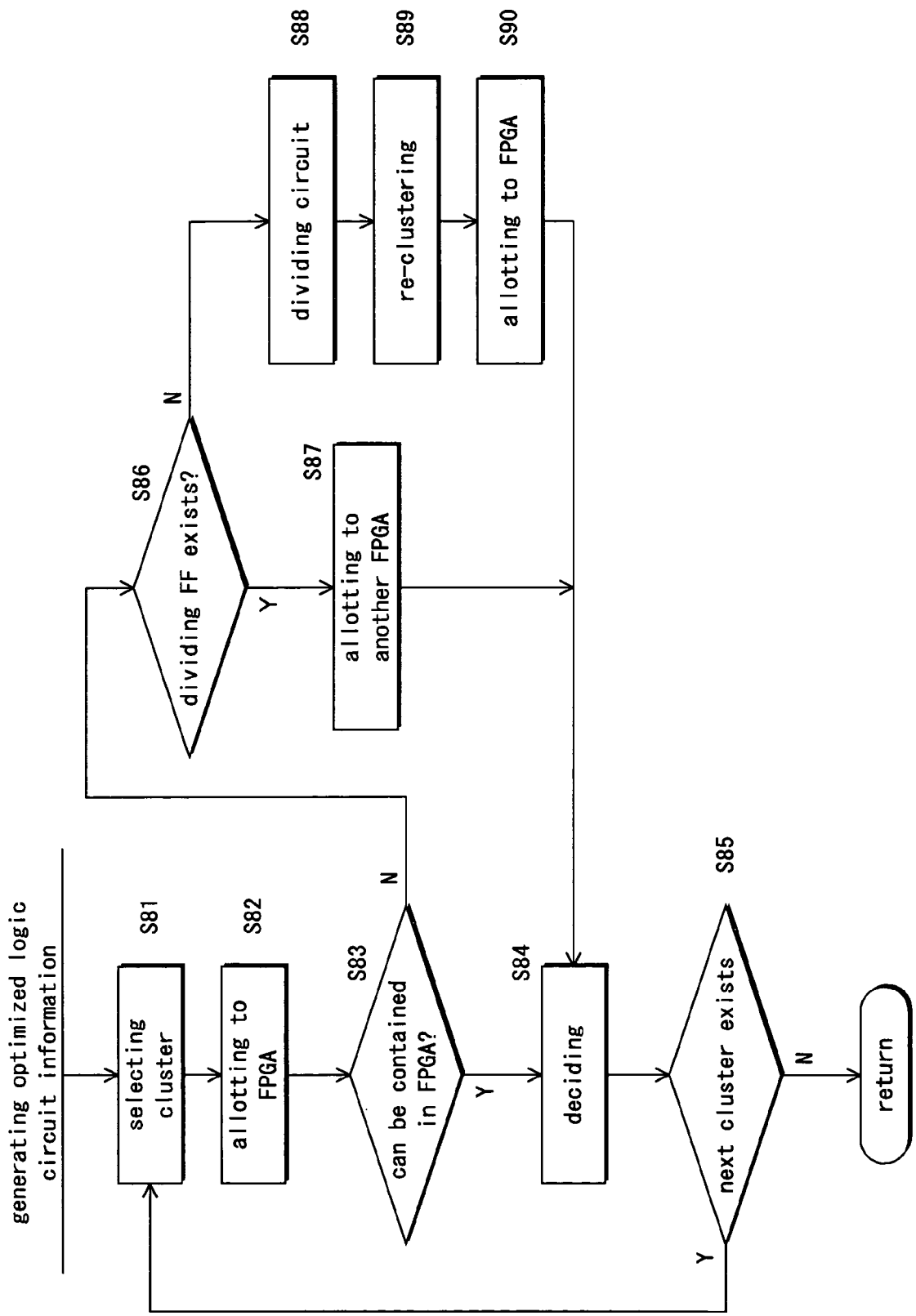
FIG. 9 is a flow chart illustrating a logic-circuit-optimizing-information generating process by a logic circuit optimizing device according to the second embodiment of the present invention.

FIG. 9 is a flow chart generating the optimized logic circuit information by the logic circuit optimizing device 8, according to the present embodiment.

The processes from step S1 to step S7 shown in FIG. 7 are assumed already finished.

As shown in FIG. 9, at step S81, the optimized-logic-circuit-information generating unit 88 selects one cluster contained in the circuit dividing logic circuit information.

At step S82, the optimized-logic-circuit-information generating unit 88 allots the selected cluster to an FPGA.

At step S83, the optimized-logic-circuit-information generating unit 88 judges whether the allotted cluster is contained within the FPGA.

When the allotted cluster is judged to be contained within the FPGA at step S83, the optimized-logic-circuit-information generating unit 88 decides the allotment information on the cluster at step S84.

Meanwhile, when the allotted cluster is judged not to be contained in the FPGA at step S83, the process goes to step S86.

At step S86, the optimized-logic-circuit-information generating unit 88 judges whether a dividing flip-flop has already been inserted into the cluster that can not be contained (called hereinafter, the "over-flow cluster").

When the dividing flip-flop is judged to have been inserted in the over-flow cluster at step S86, the optimized-logic-circuit-information generating unit 88 goes to step S87.

At step S87, the optimized-logic-circuit-information generating unit 88 allots the over-flow cluster to another FPGA, and proceeds to step S84, where the optimized-logic-circuit-information generating unit 88 decides the allotment information on the over-flow cluster.

Meanwhile, when a dividing flip-flop is judged not to have been inserted in the over-flow cluster at step S86, the optimized-logic-circuit-information generating unit 88 goes to step S88.

At step S88, the optimized-logic-circuit-information generating unit 88 orders the circuit dividing unit 85 to insert a dividing flip-flop into the over-flow cluster.

The circuit dividing unit 85 inserts a dividing flip-flop into the over-flow cluster upon receiving the order.

The method to insert the dividing flip-flop in this case is the same as the circuit dividing process at step S4 in FIG. 7. The dividing flip-flop is inserted at a position where no operation speed problem occurs, and the cluster is subdivided. The number of subdivision (the division number) can be set arbitrarily.

At step S89, the clustering unit 80 practices re-clustering for the cluster that the dividing flip-flop has been inserted, and updates the circuit dividing logic circuit information.

At step S90, the optimized-logic-circuit-information generating unit 88 allots the cluster obtained by subdividing, to the vacant area of the FPGA, and proceeds to step S84 where the optimized-logic-circuit-information generating unit 88 decides the allotment information on the cluster obtained by subdividing.

When another cluster exists at step S85, the process goes to step S81 and the above-described process is practiced.

Thus, the above-described process is practiced and the allotment information on all the clusters is decided, by updating the cluster one after another. Thereby the optimized logic circuit information 11 that is comprised of the updated circuit dividing logic circuit information and the decided allotment information is generated.

FIG. 9 explains an example that an operation clock FCLK of the dividing flip-flop is a pulse-shaped clock that synchronizes with the falling edge of an operation clock CLK of a usual flip-flop.

Accordingly, when the dividing flip-flop has been already inserted into a cluster that is not contained in an FPGA (step S86), step S87 is practiced, since another dividing flip-flop cannot be inserted into this cluster.

As described above, since the present embodiment includes the same structure as the first embodiment, a cluster with longer cluster length is divided into the plurality of clusters with shorter cluster length, as in the first embodiment.

In addition, pursuant to the present embodiment, a flip-flop is inserted in a cluster that is not contained in an FPGA, thereby the cluster that is not contained in the FPGA is divided into the plurality of clusters with shorter cluster length, which can improve further the utilization efficiency of the FPGA.

(Third Embodiment)

According to the first embodiment and the second embodiment, the optimizing process has been practiced for the logic circuit information 4 generated by the logic circuit composing device 9.

According to a third embodiment, the optimizing process is practiced before logic composing, that is, for a statement described in hardware description language.

The whole structure of a logic emulation system according to the third embodiment of the present invention is similar to that shown in FIG. 1. The logic emulation system in FIG. 1 is therefore described as the logic emulation system according to the third embodiment.

The structure of a circuit allocation device 1 according to the third embodiment is similar to that described in FIG. 2. The circuit allocation device 1 in FIG. 2 is therefore described as the circuit allocation device 1 according to the third embodiment.

According to the third embodiment, however, the structures of a logic circuit composing device 9 and a logic circuit optimizing device 8 are different from those described in the first embodiment. Others are same as that described in the first embodiment.

Figures 10, 11:
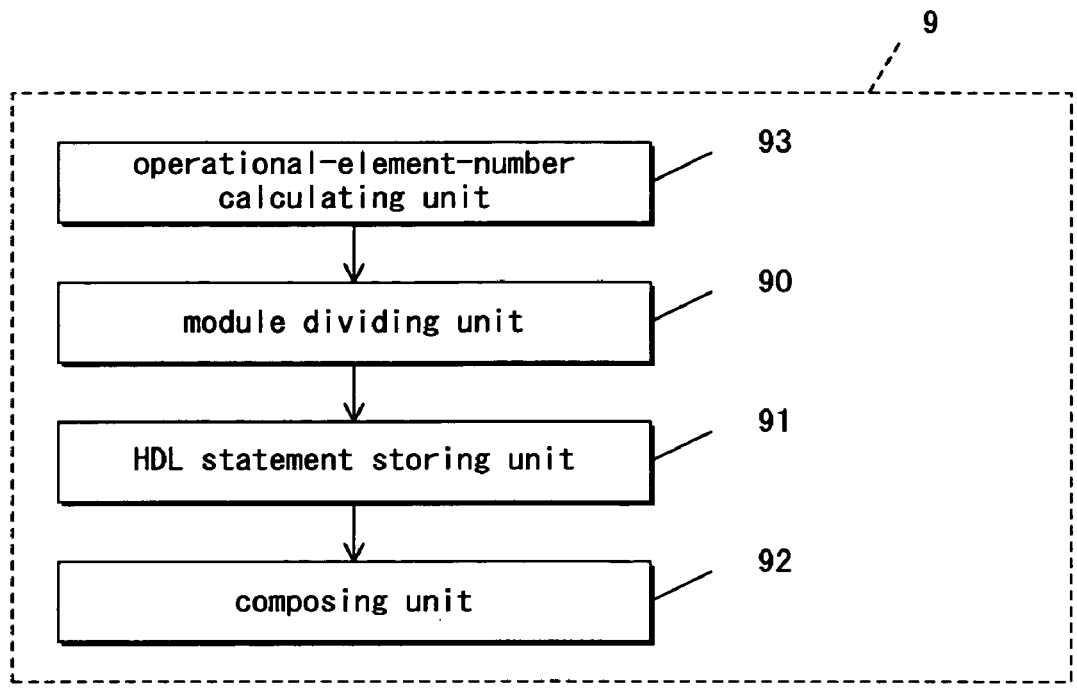
FIG. 10 is a block diagram illustrating a logic circuit composing device according to a third embodiment of the present invention.
FIG. 11 is an exemplified illustration showing a module in an HDL before inserting a function dividing flip-flop according to the third embodiment of the present invention.

FIG. 10 is a block diagram showing the logic circuit composing device 9 according to the third embodiment of the present invention.

As shown in FIG. 10, this logic circuit composing device 9 includes an operational-element-number calculating unit 93, a module dividing unit 90, an HDL (hardware description language) statement storing unit 91 and a composing unit 92.

The operational-element-number calculating unit 93 takes in the statement in hardware description language, analyzes a functional group of each module (a gang of an operational elements), and calculates the number of operational elements from an input terminal to an output terminal for every module.

The input terminal, the output terminal and the operational elements in this case are described in the hardware description language.

The module dividing unit 90 selects a module possessing a path with longer process, i.e., a path with more operational elements existing from the input terminal to the output terminal.

In this case, whether there are more operational elements from the input terminal to the output terminal is judged in comparison with a predetermined value. A user can designate this predetermined value arbitrarily.

The module dividing unit 90 inserts a dividing flip-flop described by the hardware description language into the module possessing a path with more operational elements existing from the input terminal to the output terminal.

The dividing flip-flop in this case is similar to the dividing flip-flop according to the first embodiment.

Thus, the dividing flip-flop described by the hardware description language is called a "function dividing flip-flop".

As described above, the module dividing unit 90 inserts the function dividing flip-flop into the statement in hardware description language inputted at first, and updates the statement in hardware description language.

The HDL statement storing unit 91 stores the updated statement in hardware description language.

The composing unit 92 practices logic composing, and generates the logic circuit information 4 from the updated statement in hardware description language.

The logic circuit optimizing device 8 according to the third embodiment practices clustering for the logic circuit information 4 and generates clustered logic circuit information.

The logic circuit optimizing device 8 allocates each cluster contained in the clustered logic circuit information to an FPGA with reference to the logic-emulation-device structural information 6.

The logic circuit optimizing device 8 generates the optimized logic circuit information 11 that is comprised of the clustered logic circuit information and the allotment information on the cluster. Subsequent process is similar to that described in the first embodiment.

The operation of the logic circuit composing device 9 shown in FIG. 10 will be described with examples.

FIG. 11 is an exemplified illustration showing a module in the hardware description language before the function dividing flip-flop is inserted.

Figures 12, 13:
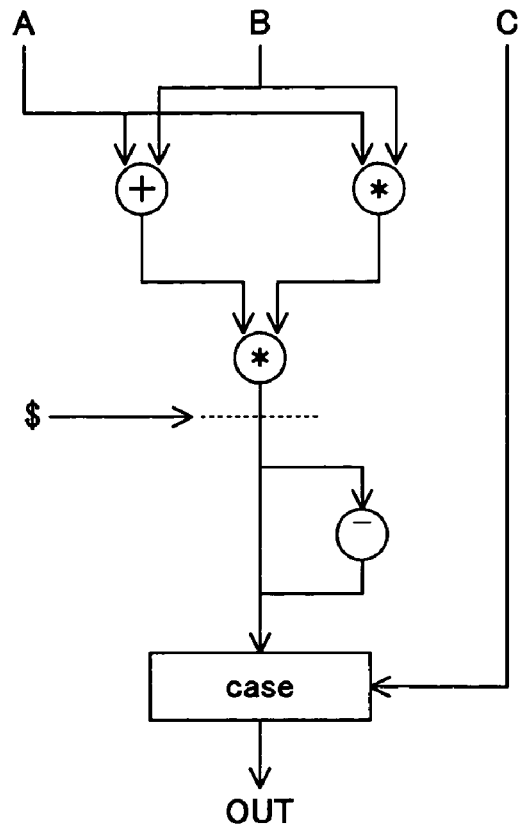
FIG. 12 is a tree diagram illustrating a module before inserting a function dividing flip-flop according to the third embodiment of the present invention.
FIG. 13 is an exemplified illustration showing a module in an HDL after inserting a function dividing flip-flop according to the third embodiment of the present invention.

FIG. 12 is a tree diagram illustrating the module in FIG. 11.

FIG. 13 is an exemplified illustration showing a module in the hardware description language after the function dividing flip-flop is inserted.

The statement in hardware description language inputted into the operational-element-number calculating unit 93 is supposed to include the module shown in FIG. 11.

This module includes function groups 40 and 41. An input A is connected to an output OUT after three operations, as is clearly shown in the function group 40.

The operational-element-number calculating unit 93 also practices such analysis for other inputs B and C.

The tree diagram shown in FIG. 12 thereby is obtained. This tree diagram is illustrated for explanation and is not actually made.

The module dividing unit 90 compares, with a predetermined value, the number of the operational elements from the inputs A, B, and C to the output OUT, obtained as a result of the analysis by the operational-element-number calculating unit 93. When the module dividing unit 90 judges that there are more operational elements from the inputs A, B, and C to the output OUT than the predetermined value, the function dividing flip-flop 42 is inserted into this module as shown in FIG. 13.

In the tree diagram in FIG. 12, the function dividing flip-flop is inserted at the position shown with the symbol "$→".

Next, the process flow by the logic circuit composing device 9 in FIG. 10 will be explained with reference to a flow chart.

Figure 14:
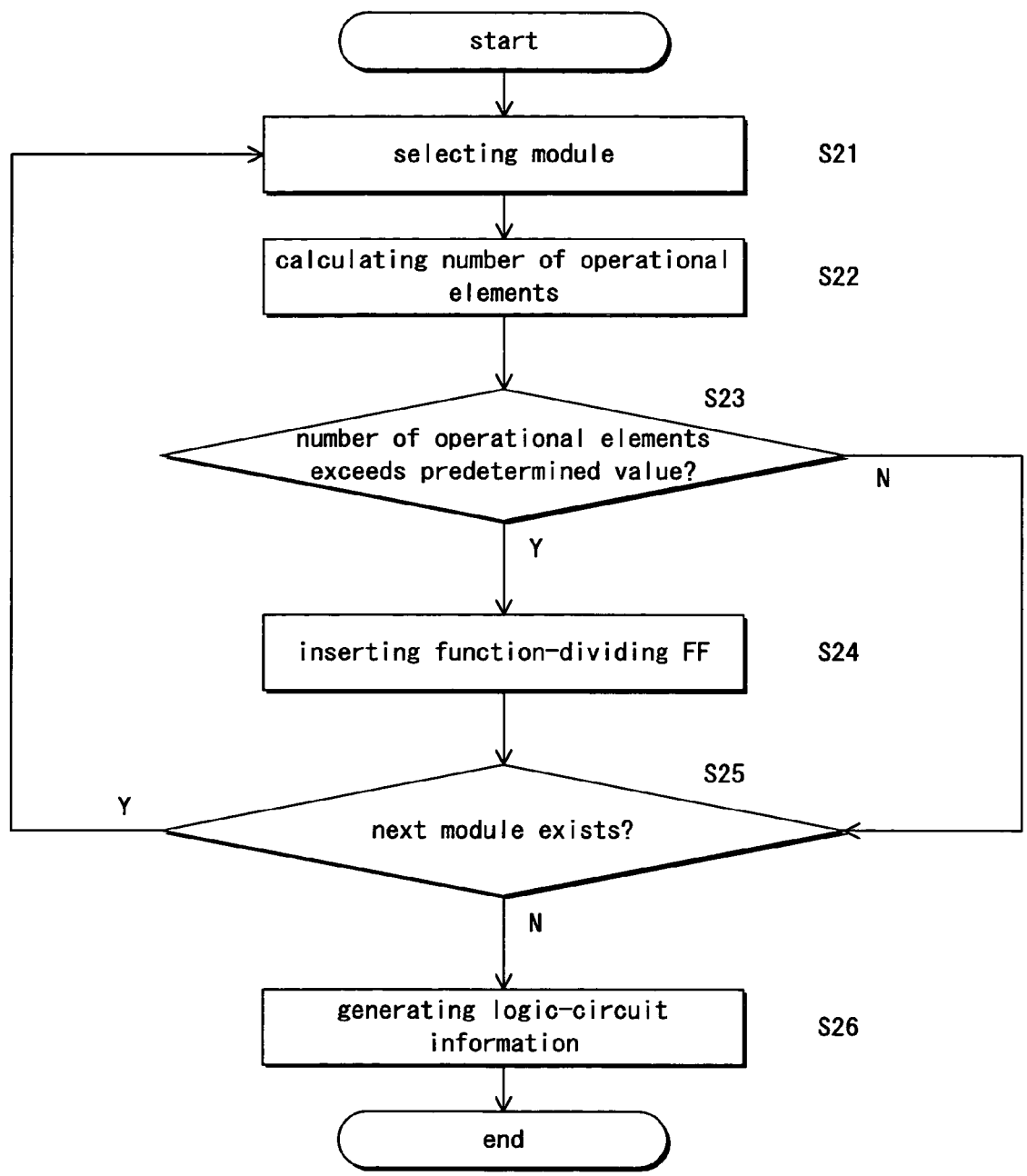
FIG. 14 is a flow chart of a logic circuit composing device according to the third embodiment of the present invention.

FIG. 14 is a flow chart illustrating the logic circuit composing device 9 in FIG. 10.

As shown in FIG. 14, at step S21, the operational-element-number calculating unit 93 selects one module contained in the statement in hardware description language.

At step S22, the operational-element-number calculating unit 93 calculates the number of operational elements from an input to an output of the module.

At step S23, the module dividing unit 90 compares the number of the operational elements calculated by the operational-element-number calculating unit 93 with a predetermined value. When the number of the operational elements is lower than the predetermined value, the process goes to step S25.

Meanwhile, at step S23, when the number of the operational elements exceeds the predetermined value, the process goes to step S24.

At step S24, the module dividing unit 90 inserts a function dividing flip-flop into the module that the number of operational elements exceeds the predetermined value.

At step S25, when there is a next module, the process goes back to step S21, and step S21 through step S25 are repeated.

By repeating the above process, the function dividing flip-flop is inserted, if necessary, and the module described in hardware description language is updated.

Meanwhile, at step S25, when there is no next module, the process goes to step S26, where the composing unit 92 generates the logic circuit information 4 from the updated module described in hardware description language.

As described above, according to the present embodiment, a dividing flip-flop described by the hardware description language is inserted into a module with more operational elements than the predetermined value.

This feature makes a cluster with shorter cluster length after the logic composing, thereby increasing the degree of freedom in allotting clusters to an FPGA in a logic emulation device. The utilization efficiency of the variable logic element can be improved.

Accordingly, the logic circuits allotted to the logic emulation device are optimized.

Since the dividing flip-flop is inserted at the description stage by the hardware description language, the process is much faster than a case where the dividing flip-flop is inserted after logic composing.

(Fourth Embodiment)

The whole structure of a logic emulation system according to a fourth embodiment of the present invention is similar to that described in FIG. 1. The logic emulation system in FIG. 1 is therefore described as the logic emulation system according to the fourth embodiment.

The structure of a circuit allocation device 1 according to the fourth embodiment is similar to that described in FIG. 2. The circuit allocation device 1 in FIG. 2 is therefore described as the circuit allocation device 1 according to the fourth embodiment. The structure of a logic circuit optimizing device 8 according to the fourth embodiment, however, is different from the structure of the logic circuit optimizing device 8 according to the first embodiment.

Figure 15:
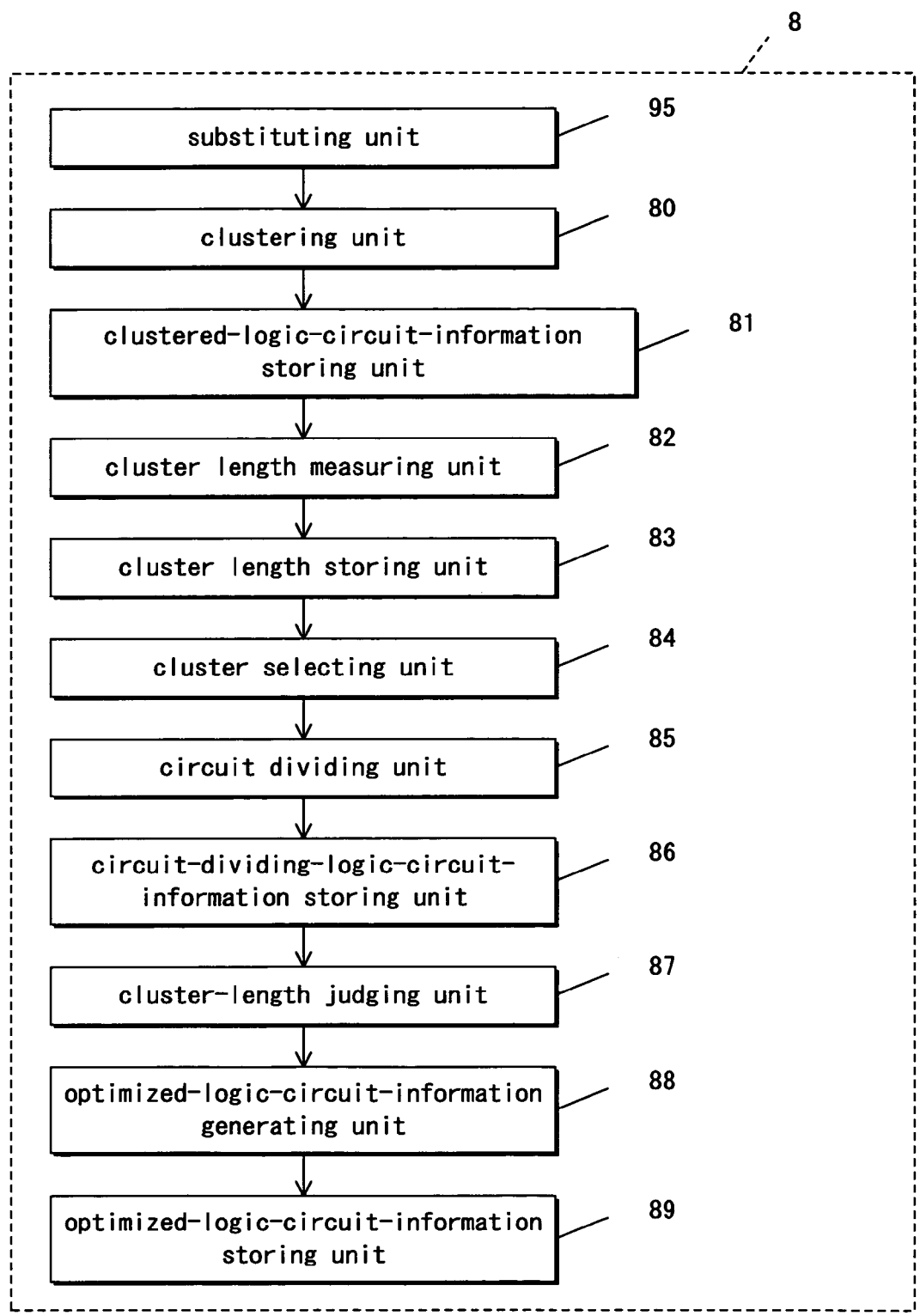
FIG. 15 is a block diagram illustrating a logic circuit optimizing device according to a fourth embodiment of the present invention.

FIG. 15 is a block diagram illustrating the logic circuit optimizing device 8 according to the fourth embodiment of the present invention. In FIG. 15, the explanation is omitted for the same parts as in FIG. 3 by attaching the same reference numerals.

As shown in FIG. 15, in this logic circuit optimizing device 8, a substituting unit 95 is added to the structure of the logic circuit optimizing device 8 in FIG. 3.

Various memory devices are contained in the circuit to be designed, such as an SRAM (static random access memory), an SDRAM (synchronous dynamic random access memory), etc., with different operation specifications.

Both of the logic emulation device 2 and the FPGA are equipped with a fixed memory device such as an SRAM.

In order to meet the operation specification of the memory device to be realized, a peripheral model circuit (wrapper circuit) is added to the fixed memory device equipped by either the logic emulation device 2 or the FPGA to realize the memory device.

Referring to memory substitution table information, the substituting unit 95 replaces the memory device as realized above with logic circuits, by expressing the fixed memory device, equipped by either the logic emulation device 2 or the FPGA, in terms of circuit length (for example, the number of circuit stages or a signal propagation time).

The above points will be explained with examples.

Figures 16, 17:
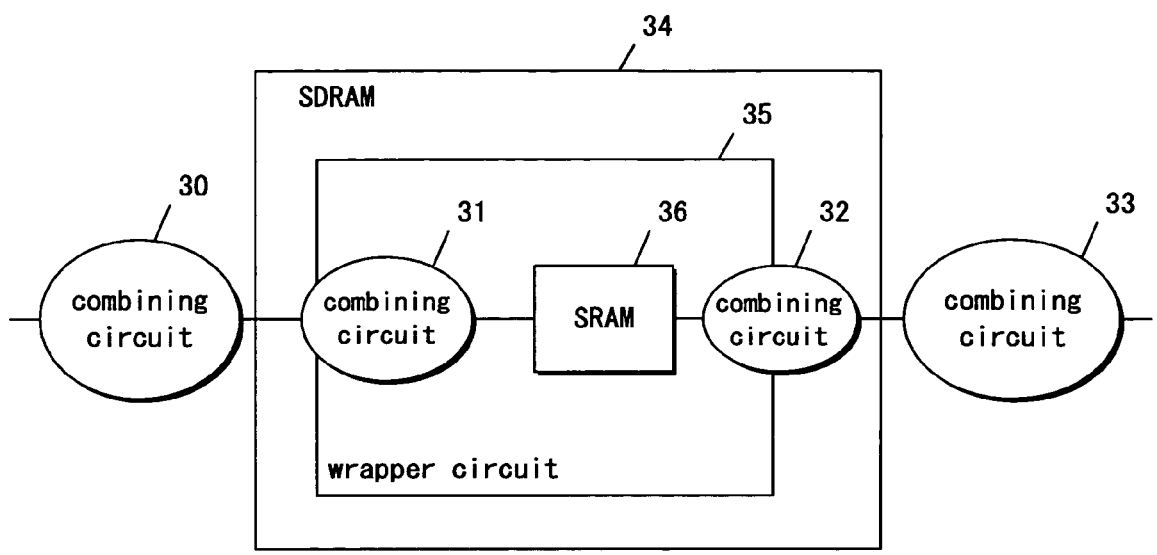
FIG. 16 is a descriptive illustration showing an operation of a logic circuit optimizing device according to the fourth embodiment of the present invention.
FIG. 17 is an exemplified illustration showing memory substituting table information according to the fourth embodiment of the present invention.

FIG. 16 is a descriptive illustration showing an operation of the substituting unit 95 in FIG. 15.

FIG. 17 is an exemplified illustration of memory substitution table information.

As shown in FIG. 16, in order to meet with the operation specification of an SDRAM34 that is a memory device to be realized, a wrapper circuit 35 comprising combining circuits 31 and 32 is added to an SRAM36, which is the fixed memory device equipped by either the logic emulation device 2 or the FPGA, thus realizing the SDRAM34. The SDRAM34 is connected to combining circuits 30 and 33.

The information on the SDRAM34 thus realized is included in the logic circuit information 4.

Referring to the memory substitution table information as shown in FIG. 17, the substituting unit 95 replaces the SDRAM34 with a logic circuit, by expressing the SRAM36, contained in the logic circuit information 4, in terms of circuit length.

For example, if the SRAM36 is an SRAM with 4 Mbit, the SRAM36 is regarded as the logic circuit that the number of circuit stages is "10", according to the memory substitution table information in FIG. 17.

Thus, the SDRAM34 made by adding the wrapper circuit 35 to the SRAM36 is regarded as a usual combining circuit.

Accordingly, the logic circuit optimizing device 8 in FIG. 15 thereafter practices the same process as described in the first embodiment and practices the optimization.

In the memory substitution table information in FIG. 17, the number of circuit stages is used as a conversion value in the present example; however, a signal propagation time may be also used instead.

Next, the process flow by the logic circuit optimizing device 8 in FIG. 15 is described using a flow chart.

Figure 18:
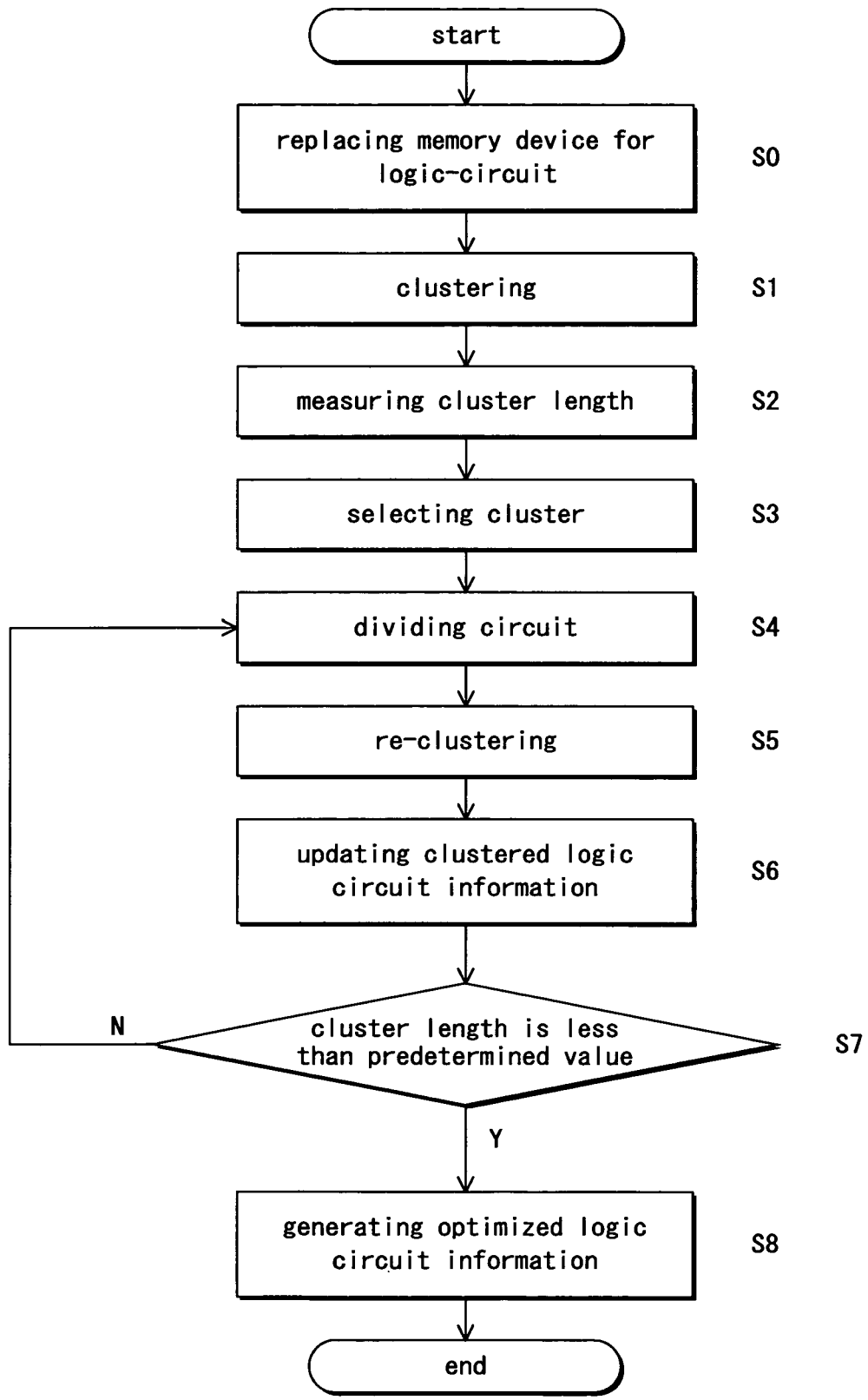
FIG. 18 is a flow chart illustrating a logic circuit optimizing device according to the fourth embodiment of the present invention.

FIG. 18 is a flow chart for the logic circuit optimizing device 8 in FIG. 15.

As shown in FIG. 18, in this flow chart, a step S0 is added before the step S1 of the flow chart shown in FIG. 7.

At step S0, referring to the memory substitution table information, the substituting unit 95 substitutes a logic circuit for a memory device to be logically emulated, by expressing a memory device that realizes the memory device to be logically emulated, in terms of circuit length.

In this way, it becomes possible to regard the memory device to be logically emulated as a combining circuit.

Thereafter, the logic circuit optimizing device 8 practices the same process from step S1 to step S8 as described in the first embodiment.

The processes at step S81 through step S90 shown in FIG. 9 may be practiced instead of the process at step S8 shown in FIG. 18.

As explained above, the present embodiment possesses the same structure as the first embodiment or the second embodiment. Therefore, the same effects as in the first embodiment or the second embodiment are enjoyed in the present embodiment.

Furthermore, according to the present embodiment, a memory device to be logically emulated is replaced with a logic circuit, by expressing a memory device that embodies the memory device to be logically emulated, in terms of circuit length.

This feature makes it possible to subdivide the memory device to be logically emulated, as in the usual circuit, by inserting a dividing flip-flop with the circuit dividing unit 85. Thereby the utilization efficiency of the FPGA is further improved.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A logic circuit optimizing method, comprising:
   clustering logic circuits included in inputted logic circuit information to obtain primary clusters;
   inserting a flip-flop to a cluster whose cluster length exceeds a predetermined cluster length, the cluster being one of the primary clusters obtained in said clustering; and
   re-clustering the flip-flop inserted cluster to obtain secondary clusters,
   wherein said inserting a flip-flop to a cluster comprises:
      measuring a cluster length of each of the primary clusters obtained in said clustering;
      selecting a cluster whose cluster length exceeds the predetermined cluster length, the cluster being one of the primary clusters obtained in said clustering; and
      inserting the flip-flop to the selected cluster,
   wherein, when there exists a cluster whose cluster length exceeds the predetermined cluster length among the primary clusters obtained in said clustering, said inserting the flip-flop to the selected cluster and said re-clustering the flip-flop inserted cluster are performed.

2. The logic circuit optimizing method as defined in claim 1, further comprising:
   inserting a flip-flop to a cluster that is too large to be contained in a variable logic element of a logic emulation device, when the cluster is allotted to the variable logic element, the cluster being included in logic circuit information after said clustering and said re-clustering; and
   re-clustering the cluster that is too large to be contained in the variable logic element of the logic emulation device after the flip-flop has been inserted therein.

3. The logic circuit optimizing method as defined in claim 1, further comprising: substituting a logic circuit for a to-be-logically-emulated memory device, by expressing a memory device in terms of circuit length, the memory device embodying the to-be-logically-emulated memory device.

4. The logic circuit optimizing method as defined in claim 3, wherein the circuit length is expressed in terms of a number of cascading circuit stages.

5. The logic circuit optimizing method as defined in claim 3, wherein the circuit length is expressed in terms of a signal propagation time.

6. The logic circuit optimizing method as defined in claim 1, wherein the cluster length is expressed in terms of a number of cascading circuit stages.

7. The logic circuit optimizing method as defined in claim 1, wherein the cluster length is expressed in terms of a signal propagation time.

8. A logic circuit optimizing method, comprising:
 inserting a flip-flop to a cluster that is too large to be contained in a variable logic element of a logic emulation device, when the cluster is allotted to the variable logic element, the cluster being included in logic circuit information after clustering; and
 re-clustering the flip-flop inserted cluster,
 wherein an operation clock frequency of the flip-flop which is inserted to the cluster that is too large to be contained in the variable logic element of the logic emulation device is higher than an operation clock frequency of a flip-flop already included in the cluster to which the flip-flop is inserted.

9. A logic circuit optimizing device, comprising:
 a clustering unit operable to cluster logic circuits included in inputted logic circuit information to obtain primary clusters;
 a cluster length measuring unit operable to measure a cluster length of each of the primary clusters obtained by said clustering unit;
 a selecting unit operable to select a cluster whose cluster length exceeds a predetermined cluster length, the cluster being one of the primary clusters obtained by said clustering unit; and
 a circuit dividing unit operable to insert a flip-flop to the selected cluster whose cluster length exceeds the predetermined cluster length, the selected cluster being one of the primary clusters obtained by said clustering unit,
 wherein said clustering unit is operable to re-cluster the flip-flop inserted cluster to obtain secondary clusters.

10. The logic circuit optimizing device as defined in claim 9, wherein said circuit dividing unit inserts a flip-flop to a cluster that is too large to be contained in a variable logic element of a logic emulation device, when the cluster is allotted to the variable logic element, the cluster being included in logic circuit information after the clustering of the logic circuits by said clustering unit and the re-clustering of the flip-flop inserted cluster; and
 wherein said clustering unit re-clusters the cluster that is too large to be contained in the variable logic element of the logic emulation device after the flip-flop is inserted therein.

11. The logic circuit optimizing device as defined in claim 9, further comprising a substitution unit operable to substitute a logic circuit for a to-be-logically-emulated memory device, by expressing a memory device in terms of circuit length, the memory device embodying the to-be-logically-emulated memory device.

12. The logic circuit optimizing device as defined in claim 11, wherein the circuit length is expressed in terms of a number of cascading circuit stages.

13. The logic circuit optimizing device as defined in claim 11, wherein the circuit length is expressed in terms of a signal propagation time.

14. The logic circuit optimizing device as defined in claim 9, wherein the cluster length is expressed in terms of a number of cascading circuit stages.

15. The logic circuit optimizing device as defined in claim 9, wherein the cluster length is expressed in terms of a signal propagation time.

16. A logic circuit optimizing device, comprising:
 a circuit dividing unit operable to insert a flip-flop to a cluster that is too large to be contained in a variable logic element of a logic emulation device, when the cluster is allotted to the variable logic element, the cluster being included in logic circuit information after clustering; and
 a clustering unit operable to re-cluster the flip-flop inserted cluster,
 wherein an operation clock frequency of the flip-flop which is to be inserted to the cluster that is too large to be contained in the variable logic element of the logic emulation device is higher than an operation clock frequency of a flip-flop already included in the cluster to which the flip-flop is to be inserted.

* * * * *